United States Patent [19]

Matsukawa et al.

[11] Patent Number: 5,686,143
[45] Date of Patent: Nov. 11, 1997

[54] RESIST TREATING METHOD

[75] Inventors: Hiroyuki Matsukawa; Akira Yonemizu, both of Kumamoto; Michiaki Matsushita, Yatsushiro; Akihiro Fujimoto, Kumamoto-ken; Takashi Takekuma, Yamaga; Hidetami Yaegashi, Kokubunji; Takahide Fukuda, Kumamoto, all of Japan

[73] Assignees: Tokyo Electron Limited, Tokyo; Tokyo Electron Kyushu Limited, Tosu, both of Japan

[21] Appl. No.: 597,536

[22] Filed: Feb. 2, 1996

Related U.S. Application Data

[62] Division of Ser. No. 336,213, Nov. 4, 1994, Pat. No. 5,518,542.

[30] Foreign Application Priority Data

Nov. 5, 1993 [JP] Japan .................................. 5-300985
Nov. 12, 1993 [JP] Japan .................................. 5-307132
Dec. 28, 1993 [JP] Japan .................................. 5-350215

[51] Int. Cl.[6] .................................................. B05D 3/00
[52] U.S. Cl. .................................... 427/271; 427/384
[58] Field of Search .............................. 427/532, 299, 427/294, 385.5, 271, 384

Primary Examiner—Bernard Pianalto
Attorney, Agent, or Firm—Oblon, Spivak, McClelland, Maier & Neustadt, P.C.

[57] ABSTRACT

There is provided a double-sided substrate cleaning apparatus including a carrier station for loading/unloading a carrier in which objects to be processed are stored, a convey mechanism for conveying an object taken out from the carrier station, at least one cleaning mechanism, arranged along a convey path on which the convey mechanism conveys the object, for cleaning the object, and an object reversing mechanism, arranged along the convey path, for reversing the object.

6 Claims, 19 Drawing Sheets

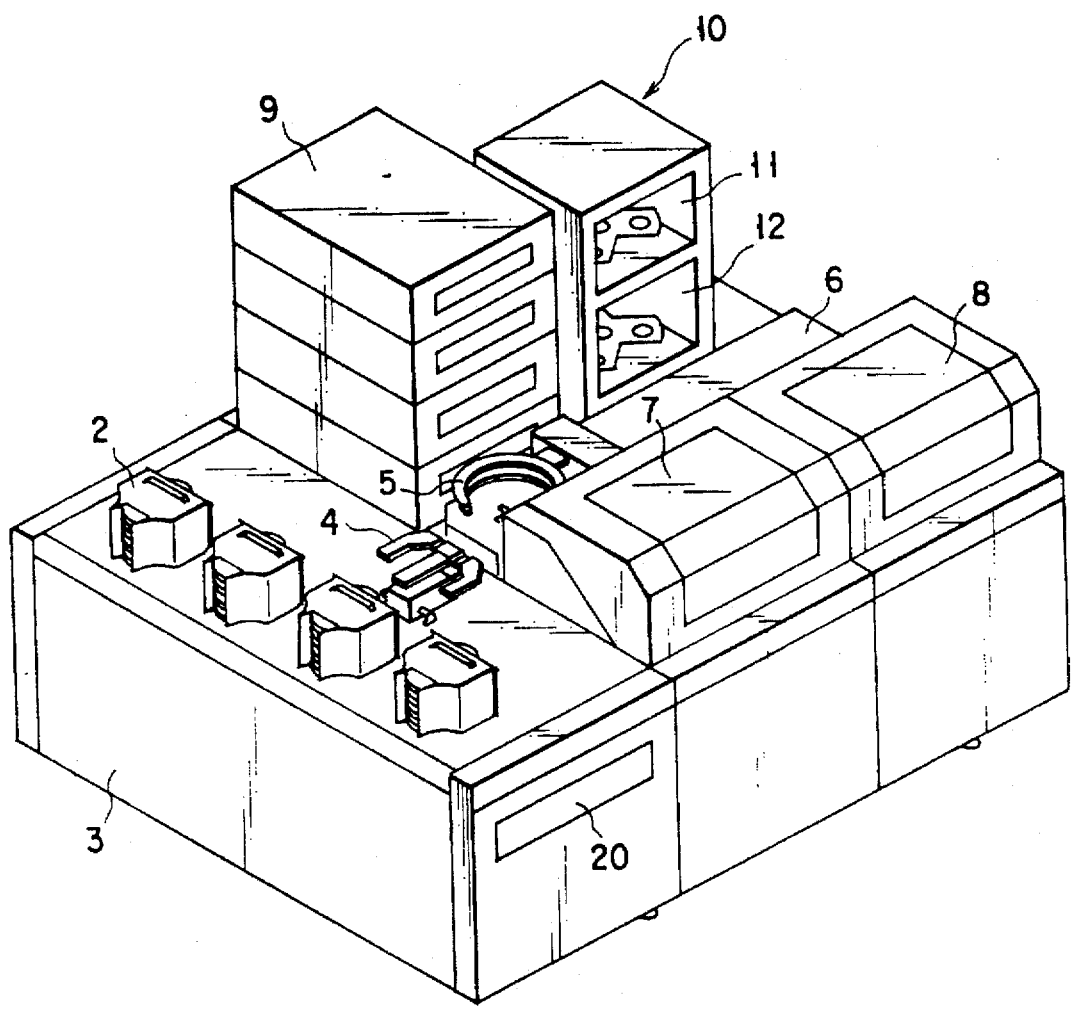
F I G. 1

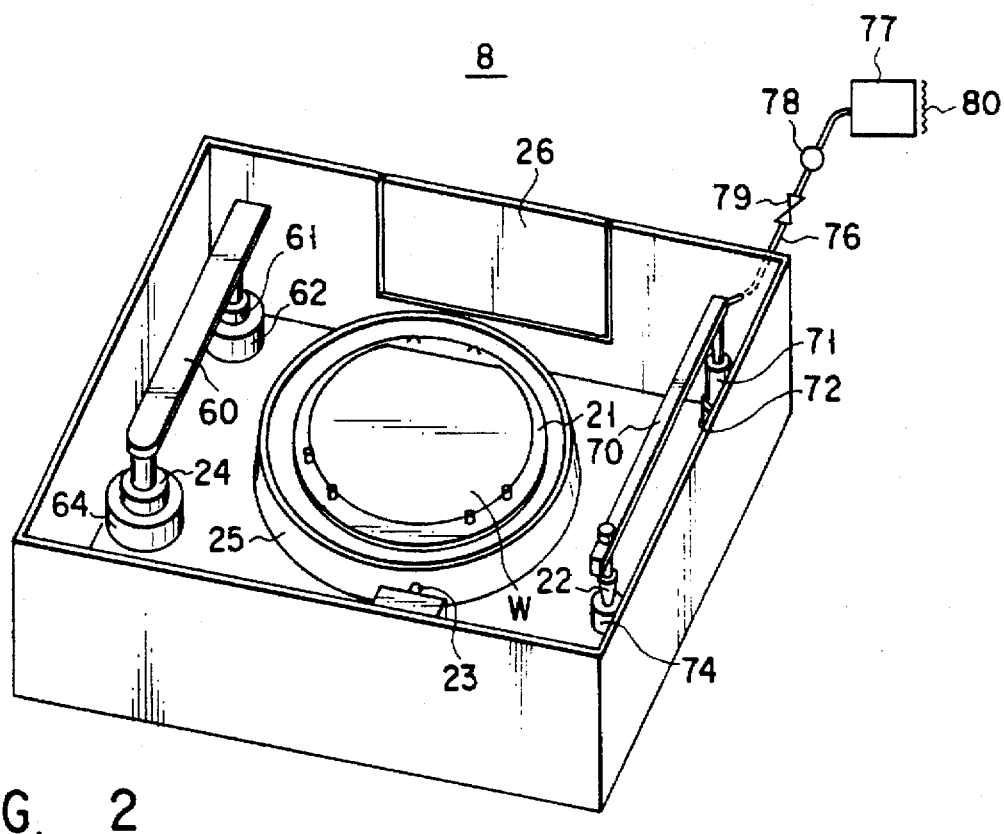
F I G. 2
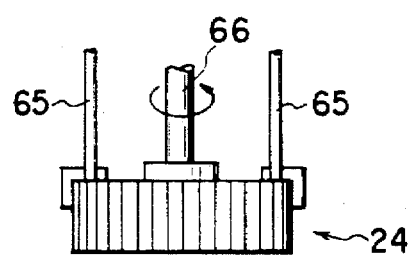
F I G. 3
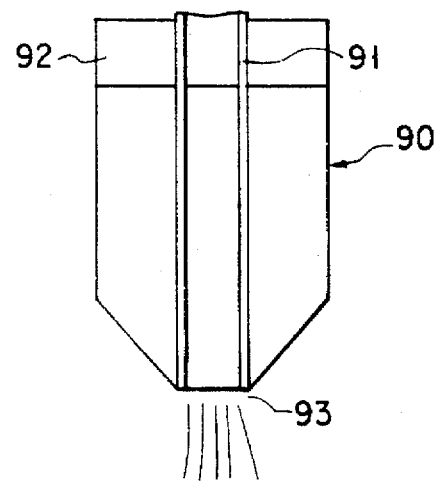
F I G. 5
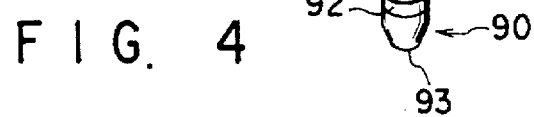
F I G. 4

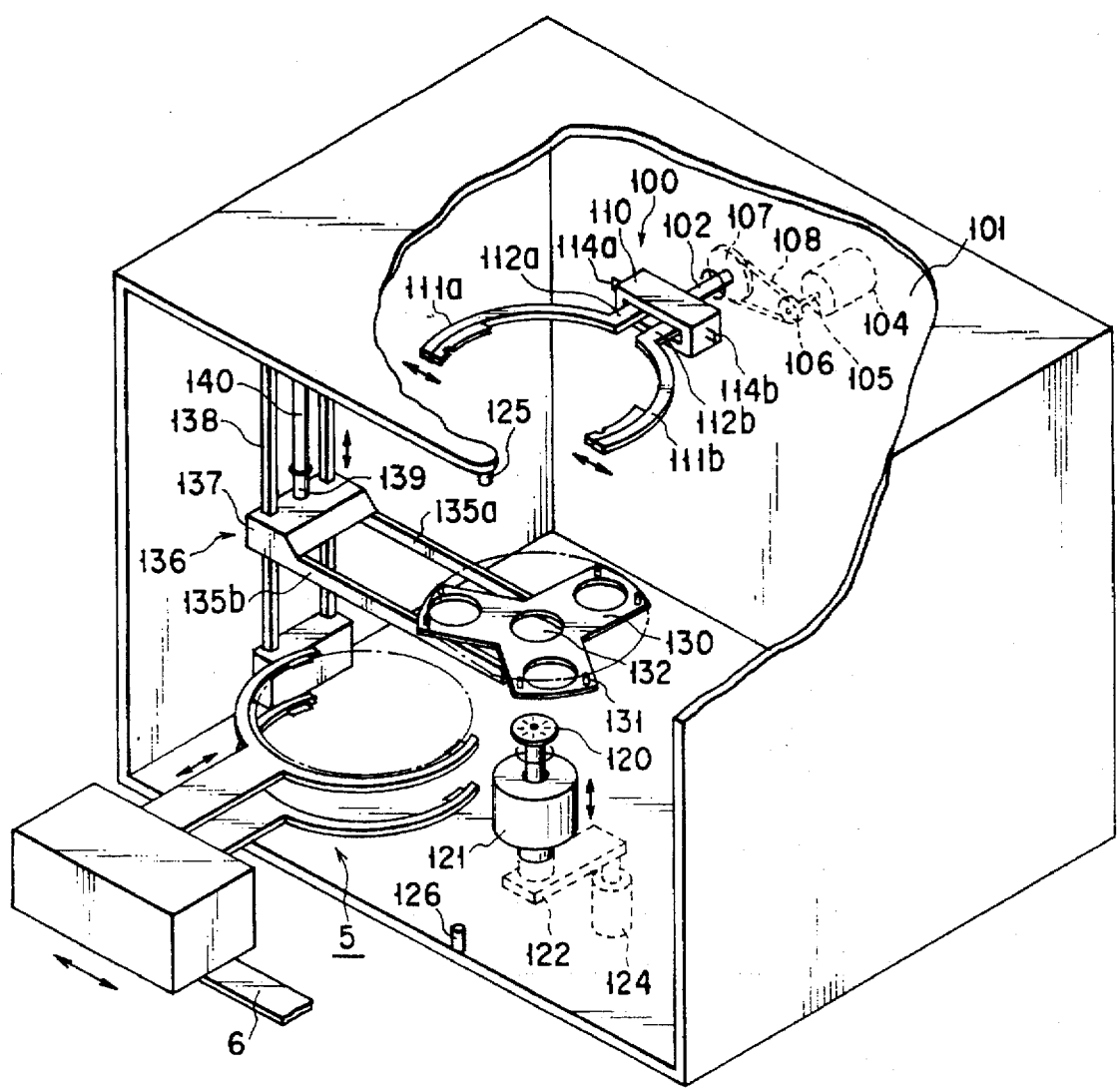
F I G. 7

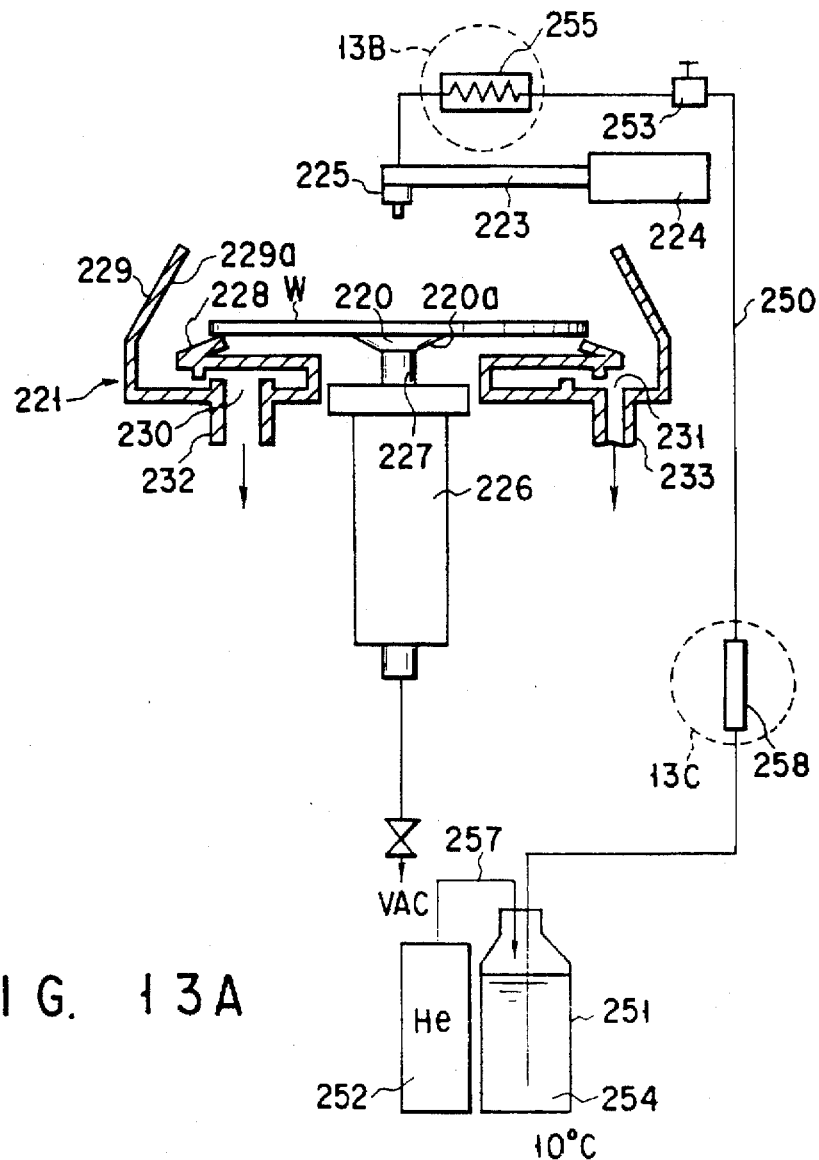
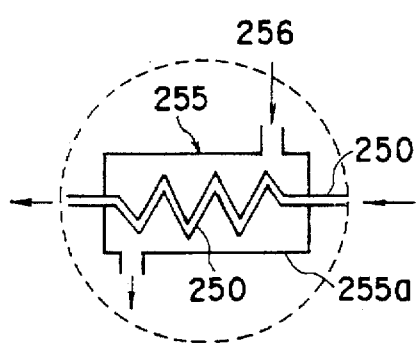
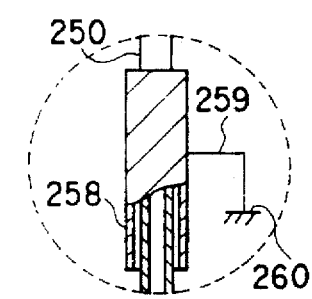
FIG. 13A
FIG. 13B
FIG. 13C

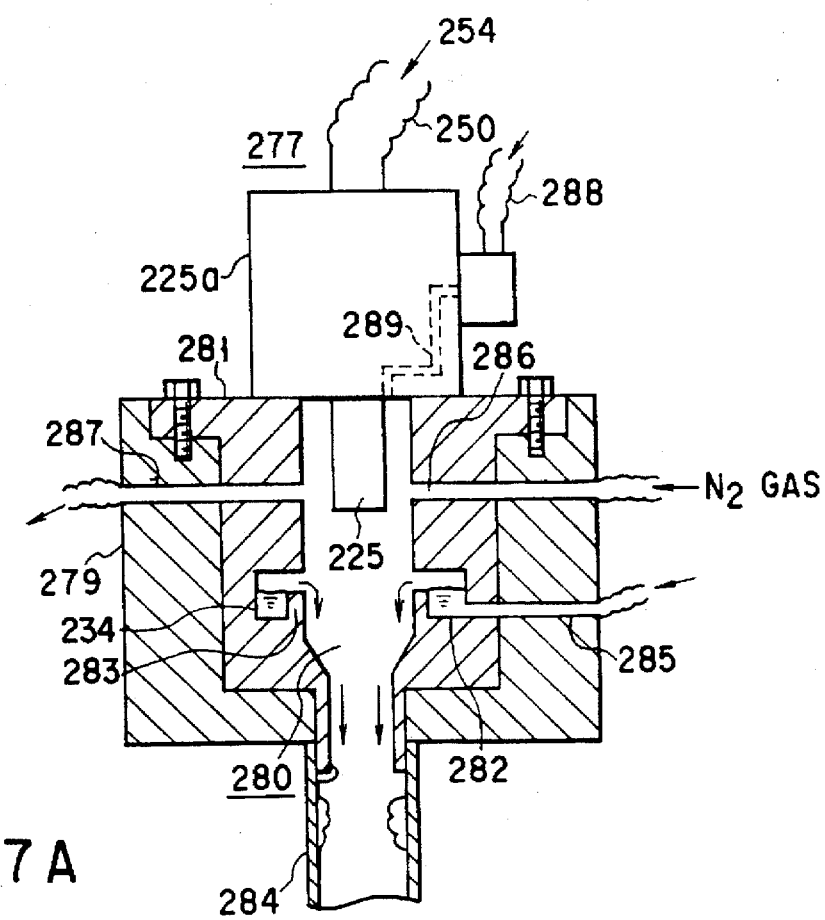
F I G. 17A
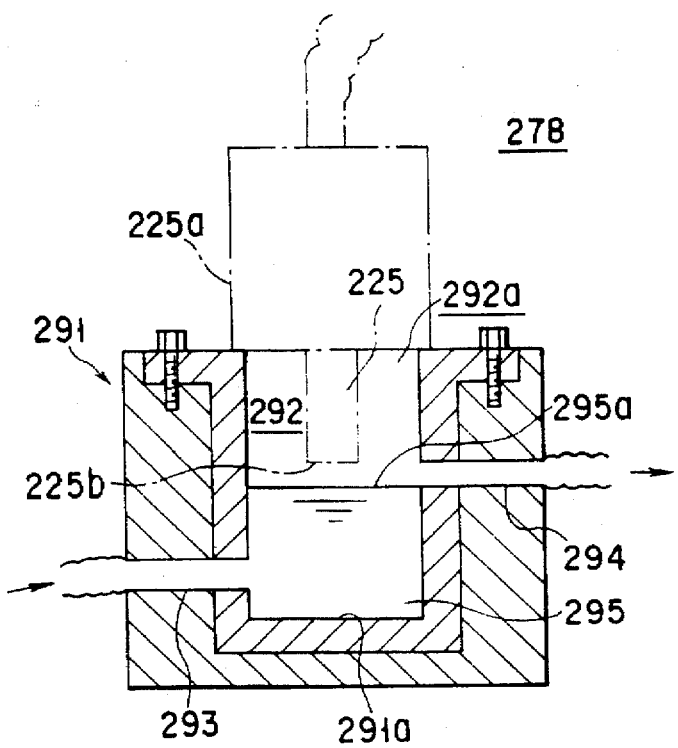
F I G. 17B

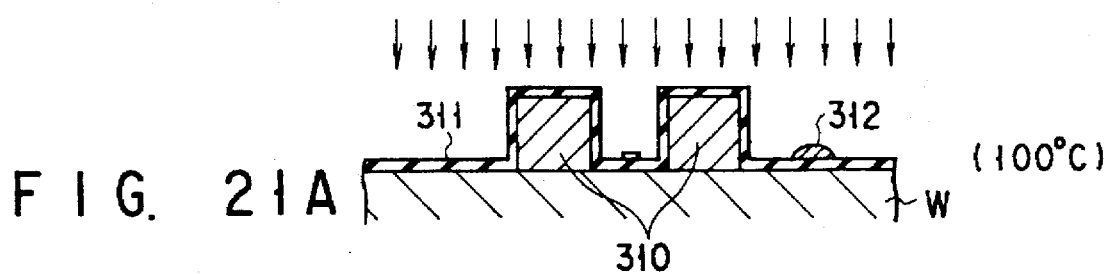
F I G. 21A
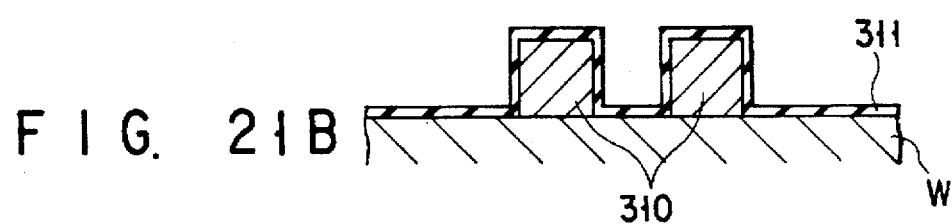
F I G. 21B
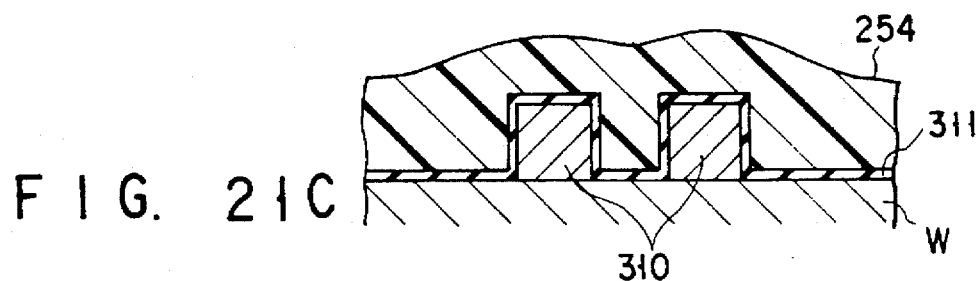
F I G. 21C
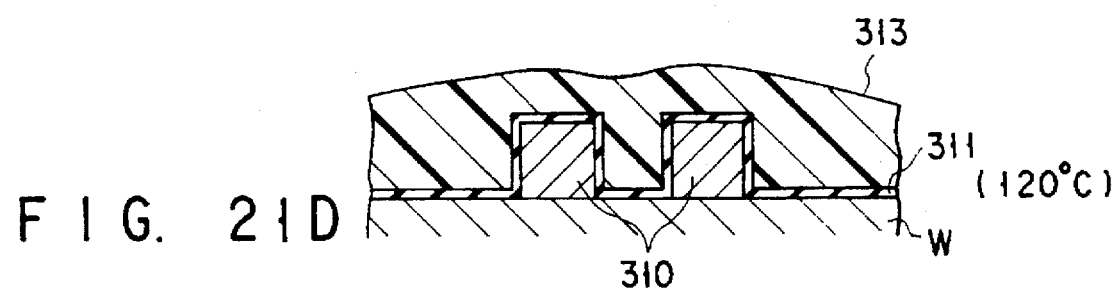
F I G. 21D
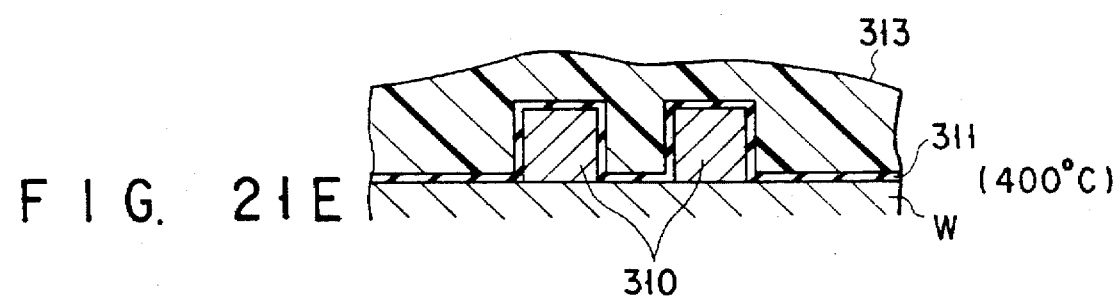
F I G. 21E

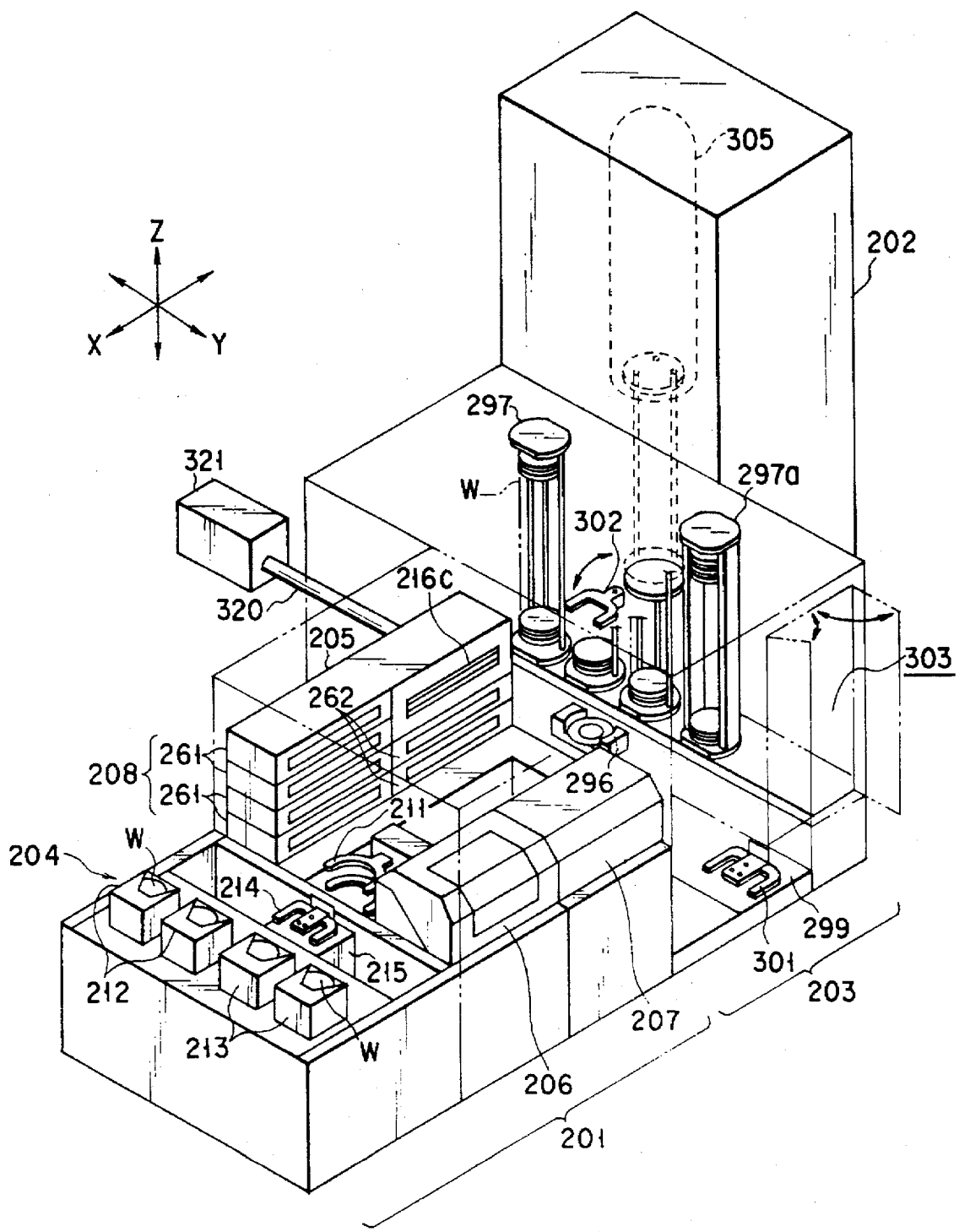
F I G. 24

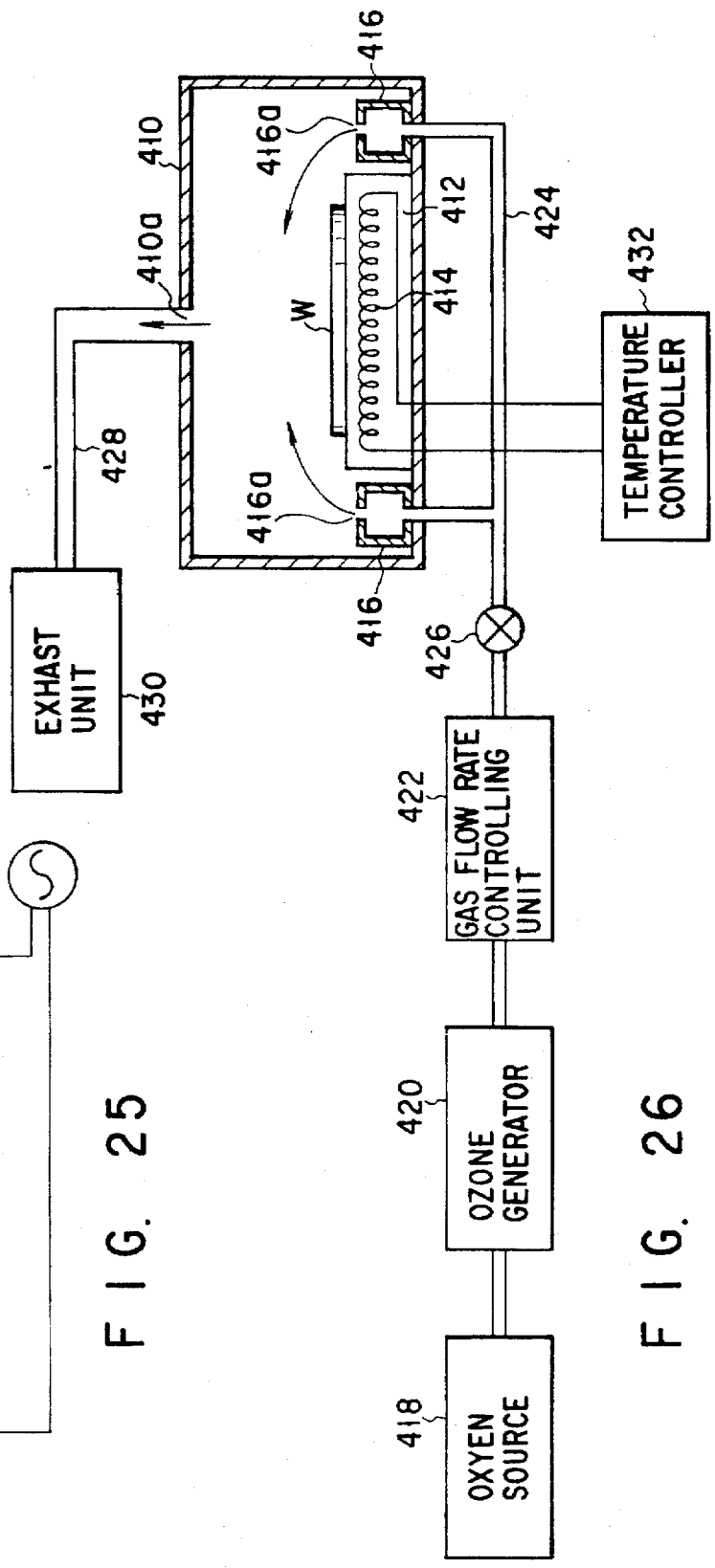
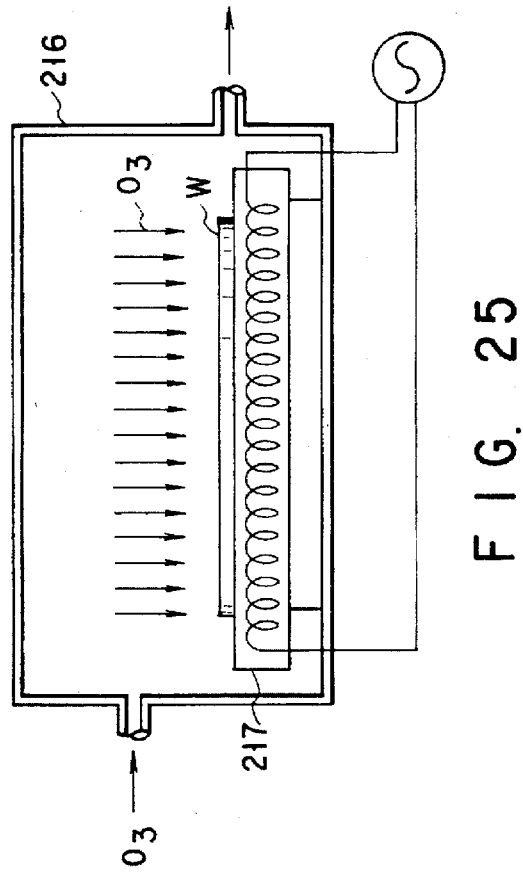
FIG. 25
FIG. 26

RESIST TREATING METHOD

This is a Division of application Ser. No. 08/336,213 filed on Nov. 4, 1994 now U.S. Pat. No. 5,518,542.

BACKGROUND OF THE INVENTION

1. Field of the Invention

The present invention relates to a an apparatus for cleaning a surface and a back surface of an object to be processed, e.g., a semiconductor wafer (to be referred to as a wafer hereinafter), and a method using the same.

2. Description of the Related Art

A method of cleaning an object to be processed, e.g., a wafer, before a coating process or the like is performed with respect thereto is disclosed in, e.g., Jpn. Pat. Appln. KOKAI publication No. 57-90941. In this method, an object to be processed is rotated while it is held in a horizontal position, and a process solution (cleaning solution) is supplied to a surface of the object. In addition, a brush is pressed against the surface of the object to remove granular contaminants therefrom. Especially in a cleaning process performed when a resist pattern is to be formed on an object to be processed, both a surface and a back surface of the object must be cleaned in some cases. Recently, as semiconductor devices increase in integration density, and various types of semiconductor devices are manufactured in small quantities, surface treatment and back surface treatment of wafers are performed in an arbitrary order. However, there is no cleaning apparatus which can cope with such various processes.

SUMMARY OF THE INVENTION

It is an object of the present invention to provide an apparatus which can cope with various processes and quickly clean a surface and a back surface of an object to be processed, and a method using the same.

In order to achieve the above object, there is provided a double-sided substrate cleaning apparatus comprising a carrier station for loading/unloading a carrier in which an object to be processed is stored, a convey mechanism for conveying the object taken out from the carrier station, at least one cleaning mechanism, arranged along a convey path on which the convey mechanism conveys the object, for cleaning the object, and an object reversing mechanism, arranged along the convey path, for reversing the object. According to the double-sided substrate cleaning apparatus having the above arrangement, various steps can be properly handled, and a surface and a back surface of an object to be processed can be quickly cleaned, thereby improving the throughput of various processes.

In this case, the cleaning mechanism is a surface cleaning mechanism for cleaning a surface of the object, or a back surface cleaning mechanism for cleaning the back surface of the object. In addition, a heating means for heating the object is preferably arranged along the convey path. Furthermore, the object reversing mechanism preferably includes an orientation flat aligning mechanism for performing orientation flat alignment of the object. Moreover, the carrier station, the convey mechanism, the convey path, the object reversing mechanism, and the cleaning mechanism are preferably arranged in a single housing.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1 and 8 are perspective views showing double-sided substrate cleaning apparatuses of the present invention;

FIG. 2 is a perspective view showing a back surface brush scrubber in a double-sided substrate cleaning apparatus of the present invention;

FIG. 3 is a view showing another structure of the brush of the back surface brush scrubber;

FIGS. 4 and 5 are schematic views showing a megasonic nozzle in the double-sided substrate cleaning apparatus of the present invention;

FIG. 7 is a perspective view showing a structure of an object reversing mechanism in the double-sided substrate cleaning apparatus of the present invention;

FIGS. 13A, 13B and 13C are schematic views showing a coating solution supply system in the SOG coating process section shown in FIG. 12;

FIGS. 14, 15, 17A, 17B, and 18 are enlarged views of the main portion of the SOG coating process section shown in FIG. 12;

FIGS. 21A, 21B, 21C, 21D and 21E, 22A, 22B, 22C, 22D, 22E, 22F, 22G and 22H, and 23A, 23B, 23C, 23D, 23E, 23F, 23G, 23H and 23I are sectional views for explaining a process method according to Example 2;

FIG. 24 is a perspective view for explaining a modification of the substrate process apparatus according to Example 2;

FIG. 25 is a view for explaining a surface cleaning process section in the apparatus shown in FIG. 24;

FIG. 26 is a view showing the arrangement of an apparatus for performing an ozone process to remove organic substances from an SOG film in a method of forming an SOG film according to Example 3.

DETAILED DESCRIPTION OF THE PREFERRED EMBODIMENTS

Figure 6:
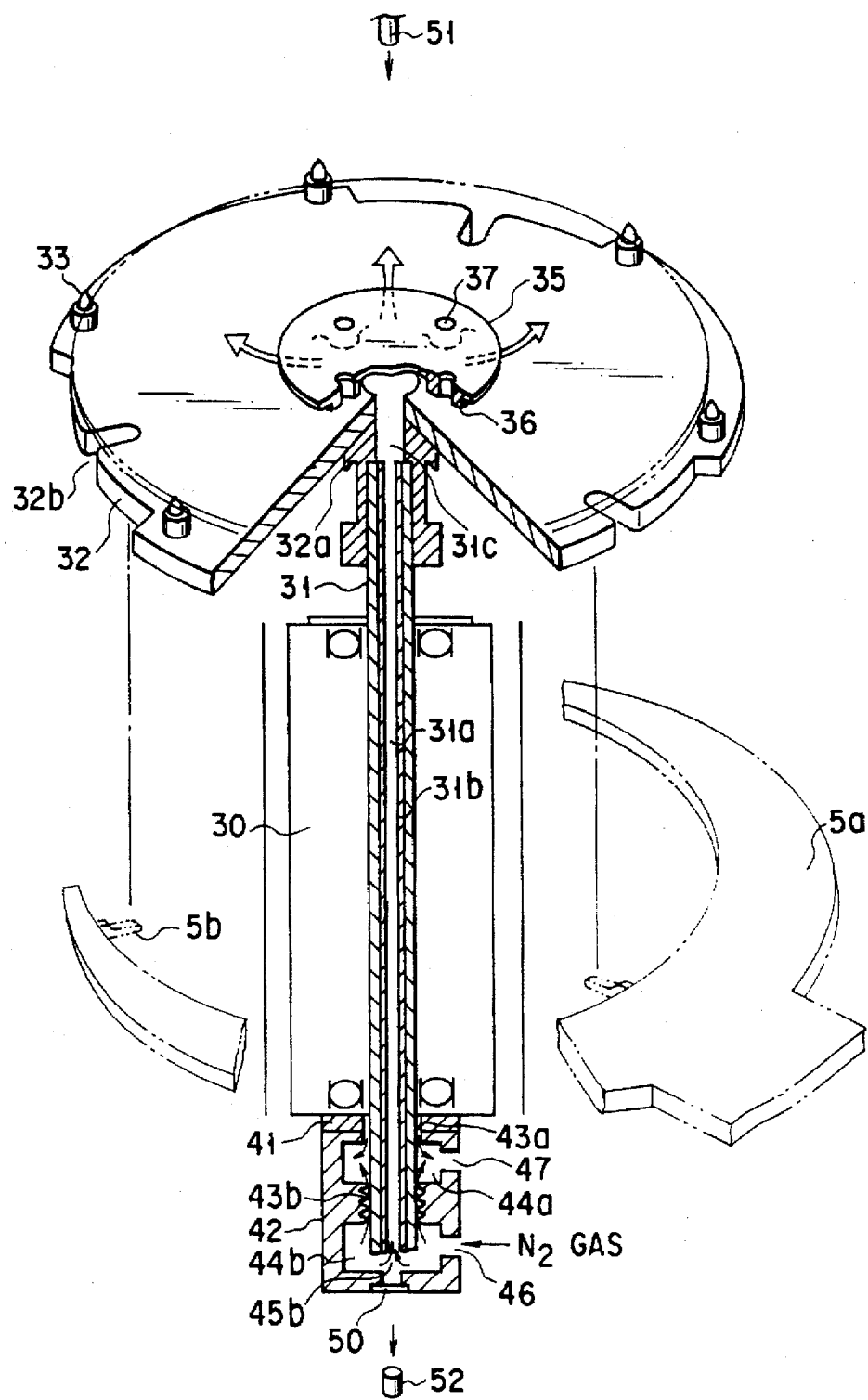
FIG. 6 is a perspective view for explaining a structure of a rotating/holding mechanism in the double-sided substrate cleaning apparatus of the present invention.

A double-sided substrate cleaning apparatus of the present invention will be described in detail below with reference to the accompanying drawings.

EXAMPLE 1

FIG. 1 is a perspective view showing an example of double-sided substrate single sheet cleaning apparatus. A double-sided substrate cleaning apparatus 1 of this embodiment includes a carrier station 3 on which a plurality of carriers 2, e.g., four carriers, each serving to store a large number of wafers W can be mounted. An auxiliary arm 4 is disposed on the central portion of the carrier station 3. The auxiliary arm 4 serves to load/unload the wafer W into/from the carrier 2 and position the wafer W. The double-sided substrate cleaning apparatus 1 also includes a convey path, e.g., a linear transfer path 6, along which a convey mechanism, e.g., a main arm 5, serving to pass/receive the wafer W to/from the auxiliary arm 4 can be moved in the longitudinal direction.

On both sides of the linear transfer path 6, various process mechanisms are arranged along the linear transfer path 6. More specifically, for example, a surface brush scrubber 7 for brushing/cleaning the surface of the wafer W and a back surface brush scrubber 8 for brushing/cleaning the back surface of the wafer W are arranged side by side on one side of the linear transfer path 6. On the other side of the linear transfer path 6, four heating units 9 are stacked on each other. The heating units 9 serve to dry the wafer W. In addition, two object reversing mechanisms 10 are stacked on each other to be located next to the heating units 9.

As shown in FIG. 2, the back surface brush scrubber 8, which is incorporated in the double-sided substrate cleaning apparatus 1 having the above arrangement, is mainly constituted by a spin chuck 21, a jet nozzle 22, a cleaning solution spray port 23, a brush 24, an opening/closing door 26, and a cap 25. The spin chuck 21 is rotated while the wafer W is held thereon in a horizontal position with a circuit pattern surface facing downward. The jet nozzle 22 serves to spray a process solution, i.e., a cleaning solution, on the upper surface of the wafer W held by the spin chuck 21. The brush 24 serves to clean/remove granular contaminants adhering to the surface of the wafer W by using a cleaning solution supplied from a cleaning solution spray port 23 formed in the scrubber body. The opening/closing door 26 is moved vertically and opened/closed when the wafer W is loaded/unloaded into/from the back surface brush scrubber 8. The cap 25 is moved vertically upon opening/closing of the opening/closing door 26 so as to prevent a cleaning solution and the like from scattering in cleaning the wafer W.

As shown in FIG. 6, the spin chuck 21 has a rotating plate 32 mounted horizontally on the upper end portion of a driving shaft 31 which is rotated by a motor 30 as a driving source. A guide plate 35 as a fluid guide means for guiding the flows of an $N_2$ gas, clean air, and a cleaning solution to the peripheral portion of the wafer W is mounted above a fluid outlet 31c in the driving shaft 31 at a boss portion 32a on which the rotating plate 32 is mounted. The guide plate 35 is made of a disk-like member. Four leg portions 36 are concentrically arranged on the lower surface of the guide plate 35. The guide plate 35 is fixed on the boss portion 32a with screws 37 extending through the leg portions 36. Holding pawls 33 for supporting the edge portion of the wafer W and holding it in a horizontal position are arranged on the outer peripheral portion of the rotating plate 32 at predetermined angular intervals.

Three slits 32b are formed in the outer circumferential portion of the rotating plate 32. When the main arm 5 is moved vertically, three wafer locking pawls 5b formed on the inner circumference of a U-shaped arm body 5a pass through the slits 32b and support the wafer W. With this operation, the wafer W can be transferred.

For example, the driving shaft 31 is constituted by a stainless steel hollow shaft. The driving shaft 31 constitutes a fluid path 31a through which a fluid flows to the back surface of the wafer W. A dirt-proof fluoroplastic tube 31b is fitted in the driving shaft 31. The driving shaft 31 extends through the motor 30. The lower portion, of the driving shaft 31, located on the fluid inlet side protrudes downward from the lower end of the motor 30. A seal block 42 consisting of, e.g., stainless steel is fixed to the lower end portion of the motor 30 via an insulating intermediate block 41 consisting of vinyl chloride. The driving shaft 31 is inserted into this seal block 42. In this case, first and second chambers (space portions) 44a and 44b are formed in the seal block 42. The first chamber 44a is partitioned from the motor 30 via a first seal member 43a (e.g., an O-ring or a mechanical seal) mounted on the intermediate block 41. The second chamber 44b is partitioned below the first chamber 44a via a labyrinth seal 43b serving as a second seal member which is not in contact with the outer surface of the driving shaft 31. The labyrinth seal 43b is mounted around the driving shaft 31 with a small gap being ensured therebetween as follows. First, a sheet is wound on the driving shaft 31. After the labyrinth seal 43b is mounted, the sheet wound on the driving shaft 31 is removed. Since the intermediate block 41 is an insulating member, whether the labyrinth seal is not in contact with the driving shaft 31 is checked by electrically checking conduction between the driving shaft 31 and the labyrinth seal 43b (specifically the seal block 42).

A fluid outlet 47 connected to a suction means such as a vacuum pump (not shown) is formed in the first chamber 44a of the seal block 42. The second chamber 44b has a fluid supply port 46 which is caused to communicate with the fluid path 31a of the driving shaft 31 via a fluid inlet 45b and connected to a source (not shown) for supplying a fluid, e.g., a nitrogen ($N_2$) gas. Therefore, an $N_2$ gas supplied from the $N_2$ gas source into the second chamber 44b flows between the wafer W and the rotating plate 32 through the fluid path 31a of the driving shaft 31 so as to flow in the direction of the peripheral portion of the wafer W, thereby preventing a cleaning solution supplied onto the surface of the wafer W from flowing to the back surface of the wafer W. In addition, the $N_2$ gas supplied into the second chamber 44b flows into the first chamber 44a through a small gap between the labyrinth seal 43b and the driving shaft 31. Thereafter, the $N_2$ gas is discharged from the fluid outlet 47. With this arrangement, the pressure in the first chamber 44a can be set to be lower than that in the second chamber 44b. With this ejector effect, dust and the like produced at a bearing 30a of the driving shaft 31 and adhering to the first seal member 43a are discharged together with a discharge flow.

Note that a through hole 42a is formed in the bottom portion of the seal block 42 in the same direction as that of the fluid path 31a of the driving shaft 31. A transparent plate 50 consisting of, e.g., quartz glass is mounted on an opening portion of the through hole 42a. A light-emitting element 51 is arranged above the driving shaft 31, and a light-receiving element 52 is arranged below the transparent plate 50. With this arrangement, light emitted from the light-emitting element 51 is received by the light-receiving element 52. Therefore, the presence/absence of the wafer W placed on the spin chuck 21 can be detected by the light-emitting element 51 and the light-receiving element 52.

The brush 24 for cleaning the wafer W is designed to be rotated about its axis and is fixed to one end of a brush arm 60. The other end of the brush arm 60 is supported by a scanner 61. With the driving operation of the scanner 61, the brush 24 can be swung (rotated/driven) across a swing region between the wait position shown in FIG. 2 and the surface (the cleaning position) of the wafer W via the brush arm 60.

An elevating mechanism 62 for vertically moving the scanner 61 and the brush arm 60 together is disposed under the scanner 61. When the brush 24 is to be swung between the wait position and the cleaning position, the elevating mechanism 62 vertically moves the scanner 61 and the brush arm 60 together to prevent the brush 24 from colliding with the cap 25 and the like. A brush cleaning unit 64 for cleaning the brush 24 set at the wait position is disposed under the wait position of the brush 24.

As shown in FIG. 3, supply pipes 65 for supplying a cleaning solution may be attached to the brush 24 to be integrated with a cleaning solution supply section. With this arrangement, the cleaning solution supply section need not be arranged independently, and the apparatus can be reduced in size. In addition, since the brush 24 and the cleaning solution supply section are integrated, a cleaning solution can be efficiently supplied to a portion brought into contact with the brush 24. Although the supply pipes 65 may be attached to the brush 24, as shown in FIG. 3, a supply pipe 65 may be inserted into a rotating shaft 66 of the brush 24. In addition, a cleaning operation may be performed by using the brush having the arrangement shown in FIG. 3 and the jet nozzle 22 as a cleaning solution supply section. For example, a cleaning solution may be supplied through the supply pipes 65 shown in FIG. 3 and the jet nozzle 22. Thereafter, the supply of the cleaning solution through the supply pipes 65 or the jet nozzle 22 may be stopped, and a cleaning operation may be performed again.

As shown in FIG. 2, the jet nozzle 22 is arranged on the side opposing the brush 24 via the spin chuck 21. The jet nozzle 22 is fixed to one end of a nozzle arm 70. The other end of the nozzle arm 70 is supported by a scanner 71. With the driving operation of the scanner 71, the jet nozzle 22 can be swung (rotated/driven) across a swing region between the wait position shown in FIG. 2 and the surface (the cleaning position) of the wafer W.

An elevating mechanism 72 for vertically moving the scanner 71 and the nozzle arm 70 together is disposed under the scanner 71. When the jet nozzle 22 is to be swung between the wait position and the spray position (cleaning position), the elevating mechanism 72 vertically moves the scanner 71 and the nozzle arm 70 together so as to prevent the jet nozzle 22 from colliding with the cap 25 and the like. In addition, a jet nozzle cleaning unit 74 for cleaning the jet nozzle 22 set at the wait position is disposed under the wait position of the jet nozzle 22.

The jet nozzle 22 is connected to a distilled water tank 77 via a cleaning solution (distilled water) supply pipe 76. A pump 78 and a valve 79 are arranged midway along the cleaning solution supply pipe 76. With the pump 78 and the valve 79, a predetermined amount of distilled water as a cleaning solution is sprayed on the wafer W. As described above, the jet nozzle 22 can be moved to the surface of the wafer W to spray distilled water, supplied from the distilled water tank 77, on the surface of the wafer W. Note that a heater 80 is arranged at the outer surface side of the distilled water tank 77 to keep the temperature of distilled water constant. The cleaning efficiency can be improved by cleaning the wafer W using heated distilled water. If distilled water is heated, the cleaned wafer W itself is heated. Therefore, the drying time in a drying process after a cleaning process can be shortened.

The arrangement of the surface brush scrubber 7 is the same as that of the back surface brush scrubber 8 except that the brush scrubber 7 includes a megasonic nozzle 90, as shown in FIGS. 4 and 5, instead of the jet nozzle 22 for spraying a process solution, e.g., a cleaning solution, on the surface of the wafer W held by the spin chuck 21. The megasonic nozzle 90 is designed to apply ultrasonic waves to a cleaning solution to vibrate the solution before spraying it. More specifically, the megasonic nozzle 90 is constituted by a cleaning solution supply pipe 91 for supplying a cleaning solution, an ultrasonic oscillator 92 for causing ultrasonic vibration of the supplied cleaning solution, and a spray port 93 for spraying the cleaning solution. The ultrasonic oscillator 92 is designed to cause ultrasonic vibration of a cleaning solution within a range of, e.g., 0.5 MHz to 5 MHz. Note that the ultrasonic oscillator 92 need not be arranged in the megasonic nozzle 90 and may be mounted on any portion of the cleaning solution supply pipe 91.

The object reversing mechanism 10 will be described next. As shown in FIG. 1, the object reversing mechanism 10 has upper and lower chambers 11 and 12. As shown in FIG. 7, the lower chamber 12 has a reversing/driving section 100 to be connected to a driving shaft 102 extending through a side plate 101. The reversing/driving section 100 is constituted by a driving motor 104, a driving pulley 106 fixed to a motor driving shaft 105 of the driving motor 104, a pulley 107 fixed to the arm rotating shaft 102, and a belt 108 for coupling the two pulleys 106 and 107 to each other. The arm rotating shaft 102 is rotatably arranged via a bearing (not shown). An arm opening/closing/driving section 110 for opening/closing holding arms 111a and 111b by driving the arms is arranged on the distal end portion of the arm rotating shaft 102. Arm support portions 112a and 112b as the proximal end portions of the pair of semicircular holding arms 111a and 111b are coupled to the arm opening/closing/driving section 110. The arm support portions 112a and 112b can be moved in the horizontal direction by a cylinder mechanism (not shown).

Referring to FIG. 7, the arm support portions 112a and 112b are located close to each other, so that the holding arms 111a and 111b are in a closed state. When the arm support portions 112a and 112b are moved from this state by the cylinder mechanism in a direction to separate from each other, the holding arms 111a and 111b also separate from each other to be set in an open state. In contrast to this, when the arm support portions 112a and 112b are moved in a direction to come close to each other, the holding arms 111a and 111b also come close to each other to be set in a closed state. In this case, the closed state of the holding arms 111a and 111b indicates a state wherein the arms are closed enough to hold the wafer W from both sides thereof, whereas the open state of the holding arms 111a and 111b indicates a state wherein the arms are opened enough to release the wafer W.

In the reversing/driving section 100, when the driving motor 104 is operated to rotate the arm rotating shaft 102 through an arbitrary angle, the arm opening/closing/driving section 110 and the holding arms 111a and 111b are rotated together with the arm rotating shaft 102. A pair of shutter plates 114a and 114b are attached to two side surfaces of the arm opening/closing/driving section 110. Light-shielding type optical sensors (not shown) are mounted on both sides of the shutter plates 114a and 114b. The shutter plate 114b shields light from the optical sensor in a stationary state. In performing a reversing operation from this stationary state, when the arm opening/closing/driving section 110 is rotated (reversed) through 180°, the shutter plate 114a shields light from the optical sensor. At the timing of this light-shielding operation, the rotation of the arm opening/closing/driving section 110 is stopped to be positioned. In this manner, the holding arms 111a and 111b are rotated (reversed) through 180° at a predetermined position in the lower chamber 12 by the reversing/driving section 100 and the arm opening/closing/driving section 110.

A spin chuck 120 for holding the wafer W in alignment of the orientation flat of the wafer W is arranged on the bottom portion of the lower chamber 12 at a position immediately below the holding arms 111a and 111b. The spin chuck 120 is rotated at a constant speed by a driving motor 121. The spin chuck 120 and the driving motor 121 are supported by a support member 122. The spin chuck 120, the driving motor 121, and the support member 122 can be vertically moved together by an elevating mechanism 124.

A light-emitting section 125 and a light-receiving section 126 constituting an optical sensor for orientation flat alignment are arranged at predetermined positions on the upper and lower portions of the lower chamber 12. In performing orientation flat alignment, the wafer W is placed on the spin chuck 120 and rotated, and the light-receiving section 126 monitors light from the light-emitting section 125.

A plate-like wafer support base 130 is arranged between the holding arms 111a and 111b and the spin chuck 120 to be movable in the vertical direction. The wafer support base 130 is constituted by three plate pieces extending from the central portion in three directions at angular intervals of 120°. Support pins 131 for supporting the edge portion of the wafer W vertically extend from the distal end portions of the respective plate pieces. In addition, a central opening 132 is formed in the central portion of the wafer support base 130 to allow the spin chuck 120 to pass therethrough. The wafer support base 130 is supported by a pair of support arms 135a and 135b extending from one side surface of the lower chamber 12. The support arms 135a and 135b are vertically driven by an elevating mechanism 136 arranged on one side surface of the lower chamber 12. The elevating mechanism 136 is constituted by a block 137 fixed to the proximal end portions of the support arms 135a and 135b, a guide 138 for guiding the block 137 in the vertical direction, and a cylinder 140 having a piston rod 139 fixed to the block 137.

When the cylinder 140 is operated to move the piston rod 139 forward, the block 137 is lowered along the guide 138, and the support arms 135a and 135b and the wafer support base 130 are also lowered together with the block 137. In contrast to this, when the wafer support base 130 is moved backward, the support arms 135a and 135b and the wafer support base 130 are raised together with the block 137. With this driving operation of the elevating mechanism 136, the wafer support base 130 is moved among the first position where the wafer W is passed/received to/from holding arms 111a and 111b, the second position (between the first and third positions) where the wafer W is passed/received to/from the main arm, and the third position where the wafer W can be reversed or the wafer W is passed/received to/from the spin chuck 120.

The respective components in the upper chamber 11 respectively have the same arrangements as those in the lower chamber 12 described above, i.e., the holding arms 111a and 111b, the reversing/driving section 100, the arm opening/closing/driving section 110, the wafer support base 130, and the like, except that the upper chamber 11 includes no orientation flat aligning mechanism such as the spin chuck 120. In the upper chamber 11, only a wafer reversing operation is performed.

In the double-sided substrate cleaning apparatus of the present invention, which has the above arrangement, when the wafer W is to be cleaned, the wafer W stored in the carrier 2 mounted on the carrier station 3 is taken out by the auxiliary arm 4. The auxiliary arm 4 is moved to the position where the wafer W is transferred to the main arm 5, and the wafer W is positioned. Thereafter, the wafer W is received by the main arm 5. After this operation, different processes are performed depending on whether only a surface cleaning process is performed, only a back surface cleaning process is performed, or surface and back surface cleaning processes are continuously performed. In this embodiment, the process of performing a back surface cleaning operation after a surface cleaning operation will be described.

Since the wafer W received by the main arm 5 is held with its surface (on which a pattern is formed) facing upward, a surface back/surface reversing operation is performed by the object reversing mechanism 10. The wafer W held by the main arm 5 is then moved above the wafer support base 130 of the object reversing mechanism 10. Thereafter, the main arm 5 is moved downward to transfer the wafer W held by the main arm 5 to the wafer support base 130. The spin chuck 120, which has been waiting below the wafer support base 130, is raised through the central opening 132 in the wafer support base 130, thereby receiving the wafer W. While the spin chuck 120 is rotated, the light-receiving section 126 monitors light from the light-emitting section 125 to perform orientation flat alignment. While the orientation flat is aligned, the spin chuck 120 is stopped. Thereafter, the spin chuck 120 is lowered to place the wafer W on the wafer support base 130.

The wafer support base 130 is raised to the position where the wafer W is transferred to the holding arms 111a and 111b. At this time, the holding arms 111a and 111b are set in an open state. The holding arms 111a and 111b are closed to receive the wafer W. The wafer support base 130 is lowered to the position where the holding arms 111a and 111b can be rotated. Thereafter, the holding arms 111a and 111b are rotated by the reversing/driving section 100, thereby reversing the wafer W. The wafer support base 130 is raised again, and the holding arms 111a and 111b are opened to transfer the reversed wafer W to the wafer support base 130. The wafer support base 130 is lowered to the position where wafer W can be transferred to the main arm 5. The main arm 5 receives the wafer W from the wafer support base 130 as though scooping it up from therebelow. Thereafter, the wafer W is transferred to the back surface brush scrubber 8 by the main arm 5, and a back surface cleaning operation is performed.

Subsequently, the wafer W held by the main arm 5 is loaded through the opening/closing door 26, which is open, and moved above the spin chuck 21. The main arm 5 is then moved downward to be retreated from the spin chuck 21.

When an $N_2$ gas is supplied from the $N_2$ gas source into the second chamber 44b via the fluid supply port 46 in the seal block 42, the $N_2$ gas, except for part of the gas (to be described later), flows in the fluid path 31a via the fluid inlet 45b in the driving shaft 31 to collide with the guide plate 35. The $N_2$ gas then flows out to the back surface side (circuit pattern surface side) of the wafer W and flows to the peripheral portion of the wafer W. Owing to the flow of this $N_2$ gas, a negative pressure is produced between the back surface of the wafer W and the rotating plate 32 by the Bernoulli effect. The wafer W is chucked toward the rotating plate 32 side by this negative pressure to be held on the holding pawls 33.

While the edge portion of the wafer W is held in the above-described manner, the motor 30 is driven to rotate the driving shaft 31 so as to rotate the wafer W in a horizontal position. The brush 24 is then moved above the wafer W, and distilled water is sprayed from the cleaning solution spray port 23 onto the surface of the wafer W. With this operation, granular contaminants adhering to the surface (on which a circuit pattern is formed) of the wafer W are removed by the brush 24. In this case, the brush 24 is reciprocated between the center and peripheral edge of the wafer W to uniformly clean the entire surface of the wafer W. In this cleaning operation, the brush 24 is pressed against the wafer W while being rotated. This pressing force is set to be larger in a back surface cleaning operation than in a surface cleaning operation. This is because a rate of removing the contaminants is improved.

On the back surface side of the wafer W, the $N_2$ gas flows from the central portion of the wafer W to its peripheral edge. For this reason, a cleaning solution supplied to the surface of the wafer W can be prevented from flowing to the back surface of the wafer W. When the cleaning operation by the brush 24 is completed, the brush 24 is moved to the wait position, and spraying of the cleaning solution is stopped. After this operation, the jet nozzle 22 is moved to substantially the central position of the wafer W, and the cleaning solution is sprayed from the jet nozzle 22 onto the surface of the wafer W. The jet nozzle 22 is reciprocated between substantially the central position and peripheral edge of the wafer W to uniformly clean the entire surface of the wafer W. This cleaning process may be performed by a jet cleaning operation alone, in which a cleaning solution is sprayed from the jet nozzle 22, or by a brush cleaning operation alone, in which cleaning is performed while a cleaning solution is supplied to a position near the brush 24. Alternatively, the two cleaning operations may be performed alternately or simultaneously. These cleaning operations are variously set and performed in accordance with the type of an object to be processed and a cleaned state.

Part of the $N_2$ gas supplied into the second chamber 44b flows into the first chamber 44a through a small gap between the labyrinth seal 43b and the driving shaft 31. Thereafter, the part of the gas is discharged from the fluid outlet 47. As a result, the pressure in the first chamber 44a becomes lower than that in the second chamber 44b. Owing to this ejector effect, dust and the like produced at the bearing 30a of the driving shaft 31 and adhering to the first seal member 43a are discharged together with a discharge flow, thereby preventing the dust and the like from adhering to the back surface, i.e., the circuit pattern surface, of the wafer W. In addition, entrance of the dust and the like from the first chamber 44a into the motor 30 can be prevented.

When the back surface cleaning process is completed in this manner, the cap 25 and the opening/closing door 26 are lowered, and the main arm 5 is inserted in a portion below the spin chuck 21. Thereafter, the main arm 5 is moved upward to receive the wafer W. In this state, since the surface of the wafer W faces downward, the surface and back surface of the wafer W are reversed by the object reversing mechanism 10. After the wafer W held by the main arm 5 is moved above the wafer support base 130 of the object reversing mechanism 10, the main arm 5 is moved downward, thereby transferring the wafer W held by the main arm 5 onto the wafer support base 130. The spin chuck 120, which has been waiting below the wafer support base 130, is then raised through the central opening 132 in the wafer support base 130, thereby receiving the wafer W. Orientation flat alignment is performed by monitoring light from the light-emitting section 125 while rotating the spin chuck 120. When the orientation flat is aligned, the spin chuck 120 is stopped. Thereafter, the spin chuck 120 is lowered to place the wafer W on the wafer support base 130. The wafer support base 130 is raised to the position where the wafer W is transferred to the holding arms 111a and 111b. At this time, the holding arms 111a and 111b are set in an open state. By closing the holding arms 111a and 111b, the wafer W is received by the arms. After the wafer support base 130 is lowered to the position where the holding arms 111a and 111b can be rotated, the holding arms 111a and 111b are rotated and reversed by the reversing/driving section 100. The wafer support base 130 is raised again, and the holding arms 111a and 111b are opened to transfer the reversed wafer W onto the wafer support base 130. The wafer support base 130 is lowered to the position where the wafer W can be transferred to the main arm 5. The main arm 5 then passes below the wafer support base 130 to receive the wafer W as if the main arm 5 scooped it up from below the wafer support base 130. The main arm 5 transfers the wafer W to the surface brush scrubber 7. The surface brush scrubber 7 performs a surface cleaning process with respect to the wafer W. After this process, the wafer W held by the main arm 5 is loaded through the opening/closing door 26 which is open and moved above the spin chuck 21, and the main arm 5 is moved downward and retreated from the spin chuck 21.

At this time, when an $N_2$ gas is supplied from the $N_2$ gas source into the second chamber 44b via the fluid supply port 46 in the seal block 42, the $N_2$ gas, except for part of the gas (to be described later), flows through the fluid path 31a via the fluid inlet 45b in the driving shaft 31 and collides with the guide plate 35. As a result, the gas flows out to the back surface side (circuit pattern surface side) of the wafer W and flows to the peripheral portion of the wafer W. Owing to the flow of this $N_2$ gas, a negative pressure is produced between the back surface of the wafer W and the rotating plate 32 by the Bernoulli effect. The wafer W is chucked toward the rotating plate 32 side by this negative pressure to be held on the holding pawls 33.

While the edge portion of the wafer W is held in the above-described manner, the motor 30 is driven to rotate the driving shaft 31 so as to rotate the wafer W in a horizontal position. The brush 24 is then moved above the wafer W, and distilled water is sprayed from the cleaning solution spray port 23 onto the surface of the wafer W. With this operation, granular contaminants adhering to the surface (on which a circuit pattern is formed) of the wafer W are removed by the brush 24. In this case, the brush 24 is reciprocated between the center and peripheral edge of the wafer W to uniformly clean the entire surface of the wafer W. On the back surface side of the wafer W, the $N_2$ gas flows from the central portion of the wafer W to its peripheral edge. For this reason, a cleaning solution supplied to the surface of the wafer W can be prevented from flowing to the back surface of the wafer W. When the cleaning operation by the brush 24 is completed, the brush 24 is moved to the wait position, and spraying of the cleaning solution is stopped. After this operation, the megasonic nozzle 90 is moved to substantially the central position of the wafer W, and the cleaning solution is sprayed from the megasonic nozzle 90 onto the surface of the wafer W. The megasonic nozzle 90 is reciprocated between substantially the central position and peripheral edge of the wafer W to uniformly clean the entire surface of the wafer W. This cleaning process may be performed by a megasonic cleaning operation alone, in which a cleaning solution is sprayed from the megasonic nozzle 90, or by a brush cleaning operation alone, in which cleaning is performed while a cleaning solution is supplied to a position near the brush 24. Alternatively, the two cleaning operations may be performed alternately or simultaneously. These cleaning operations are variously set and performed in accordance with the type of an object to be processed and a cleaned state.

When the surface cleaning process is completed in this manner, the spin chuck 21 is rotated to scatter the cleaning solution from the wafer W. The wafer W is then dried. After this operation, the cap 25 and the opening/closing door 26 are lowered, and the main arm 5 is inserted below the spin chuck 21. The main arm 5 is then moved upward to receive the wafer W. The wafer W held by the main arm 5 is loaded into the heating unit 9. In order to dry the wafer W, the wafer W is heated, for example, to 100° C. for 30 sec. After the heat treatment is completed, the wafer W is held by the main arm 5 again and transferred to the auxiliary arm 4. The wafer W held by the auxiliary arm 4 is returned to the carrier 2.

The double-sided substrate cleaning apparatus of 10 the present invention may be designed such that recipes can be input through a mode screen. In the scheme of scanning the brush 24, the jet nozzle 22, the megasonic nozzle 90, and the like, a scan time for each component can be automatically set by setting a corresponding scan distance and scan speed. With regard to the rotational direction of the brush 24, the following three modes can be selected: a CW (clockwise) mode, a CCW (counterclockwise) mode, and a reverse mode as a combination of the CW mode and the CCW mode. In addition, the height and replacement period of the brush 24 and the scan range of a scan arm can be arbitrarily adjusted. Furthermore, the object reversing mechanism 10 has a check function of checking an aligning operation, a clamping operation, a reversing operation, and the like step by step.

Figure 8:
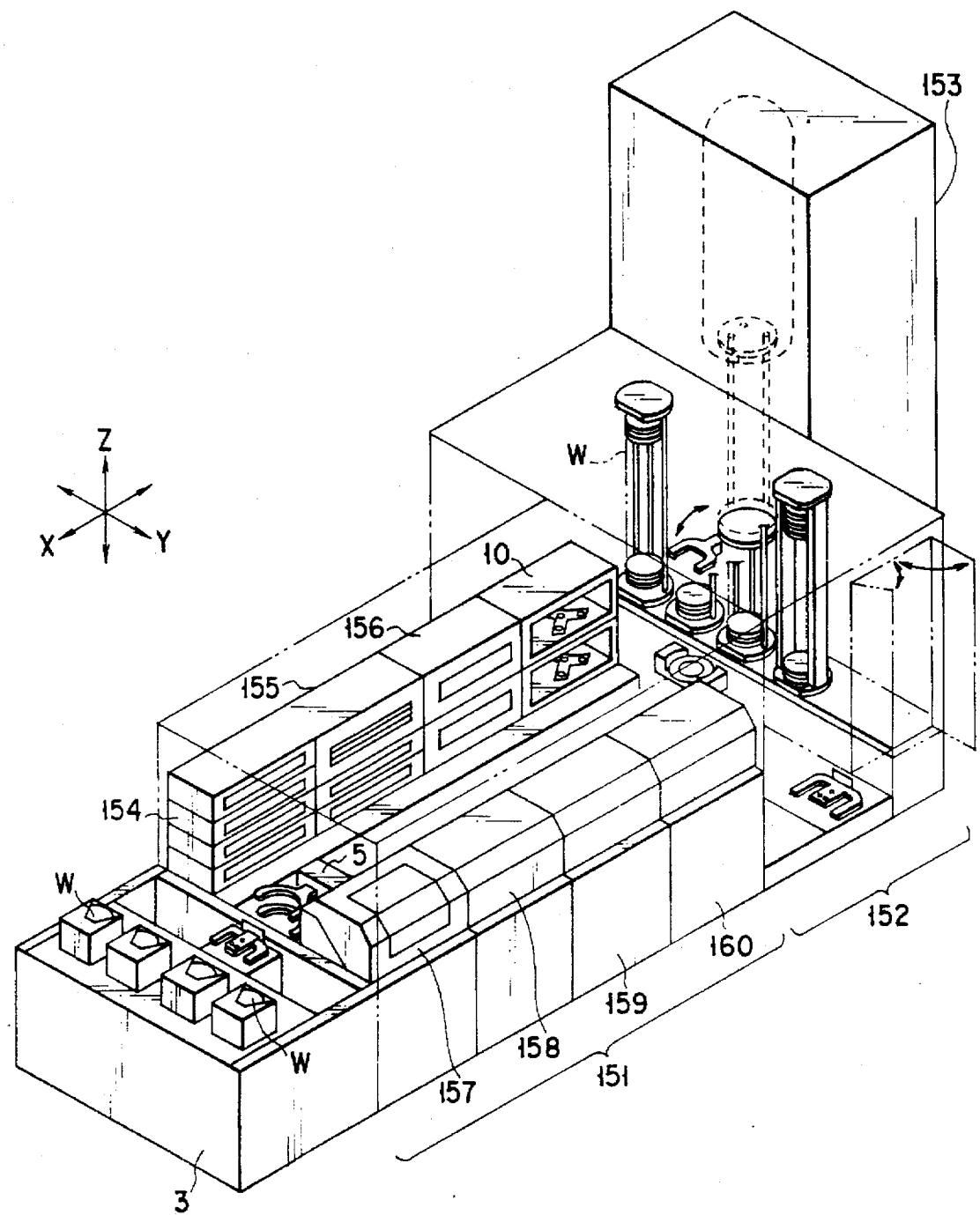

FIG. 8 shows another arrangement of the double-sided substrate cleaning apparatus of the present invention. This double-sided substrate cleaning apparatus is integrated with a coating process unit and a heat-treatment unit, and is mainly constituted by the carrier station 3, the process section 151, the interface section 152, and the heat-treatment section 153. In the process section 151, an adhesion section 154, a baking section 155, a cleaning section 156, and the object reversing mechanism 10 are sequentially arranged on one side of the main arm from the carrier station 3 to the interface section 152. A coating process section 157, a development process section 158, an exposure process section 159, and a cleaning process section 160 are sequentially arranged on the other side of the main arm from the carrier station 3 to the interface section 152.

A case wherein a resist film is formed on the wafer W in the apparatus having the above arrangement will be described. First of all, the wafer W is conveyed to the cleaning process section 160 to clean the surface of the wafer W. The wafer W is then conveyed to the adhesion section 154 to perform an adhesion process with respect to the wafer W. The wafer W is conveyed to the cleaning section 156 to perform a cleaning process with respect to the wafer W. Thereafter, the wafer W is conveyed to the coating process section 157 to coat a resist solution on the wafer W. The wafer W is conveyed to the baking section 155 to perform a baking process with respect to the wafer W so as to form a resist film thereon. After this process, the wafer W is conveyed to the cleaning section 156 to clean the wafer W. The wafer W is conveyed to the object reversing mechanism 10 to reverse the wafer W. The reversed wafer W is conveyed to the cleaning process section 160 to clean at least the back surface of the wafer W. In this manner, the back surface of the wafer W is cleaned before a resist film is exposed. With this process, foreign substances having a size of 0.1 μm or more can be removed to improve the exposure performance. This cleaning process is important for advanced micropatterning.

Subsequently, the wafer W is conveyed to the object reversing mechanism 10 to reverse the wafer W. The reversed wafer W is conveyed to the exposure process section 159 to clean the wafer W. The wafer W is then conveyed to the development process section 158 to perform a development process with respect to the wafer W. Furthermore, the wafer W is conveyed to the cleaning section 156 to clean the wafer W. Thereafter, the wafer W is conveyed to the cleaning process section 160 to clean the surface of the wafer W. In this case, if the back surface of the wafer W is to be also cleaned, the wafer W is conveyed to the object reversing mechanism 10 to reverse the wafer W. The reversed wafer W is conveyed to the cleaning process section 160 again to clean the back surface of the wafer W.

In this embodiment, a Bernoulli chuck using the Bernoulli effect is used as a chuck in reversing the wafer W in the object reversing mechanism 10. However, the effect of the present invention can also be obtained by using a chuck other than a Bernoulli chuck, e.g., a mechanical chuck disclosed in Japanese Patent Application No. 5-116390. In addition, the order of processes in the process section 151 can be arbitrarily set. In accordance with the order of processes, "only a surface cleaning operation", "only a back surface cleaning operation", and "surface and back surface cleaning operations" can be arbitrarily selected.

In the above description, an $N_2$ gas is used as a fluid to be supplied to the back surface side of the wafer W through the fluid path 31a of the spin chuck 21. This fluid is not limited to an $N_2$ gas, but a fluid such as another inert gas, air, or distilled water may be used. Especially when a fluid such as distilled water is to be used, a branch pipe path branching from the cleaning solution supply pipe is preferably connected to the fluid inlet 45b in the seal block 42. If distilled water is used as the fluid, distilled water for preventing adhesion of a cleaning solution (distilled water) to the back surface of the wafer W after it is held and distilled water for a cleaning operation can be supplied from the same distilled water tank. Therefore, the efficiency of a cleaning process can be improved, and the size of the apparatus can be reduced.

The present invention is not limited to the above processes. For example, the present invention can be applied to a case wherein a surface cleaning process is performed after a back surface cleaning process. In addition, in this embodiment, the surface of a wafer is cleaned by an ultrasonic cleaning process using the megasonic nozzle, while the back surface of the wafer is cleaned by a cleaning process using the jet nozzle. However, the present invention is not limited to this. For example, the surface of a wafer may be cleaned by the jet nozzle, and the back surface of the wafer may be cleaned by an ultrasonic cleaning process using the megasonic nozzle.

In this embodiment, an object to be processed is the wafer W. However, the present invention can be applied to an apparatus for performing a cleaning process with respect to, e.g., an LCD substrate, a photomask, a ceramic substrate, a compact disk, and a printed circuit board.

EXAMPLE 2

After a substrate is cleaned in this manner, various coating processes are performed. With the recent increase in the integration density of semiconductor integrated circuits, the number of wiring layers stacked on each other has increased.

In such a multi-layered wiring structure, an uneven lower wiring layer makes it difficult to form an upper wiring layer. For this reason, a technique of flattening an insulating interlayer for insulating lower and upper wiring layers from each other is required. As a conventional flattening technique used in forming an insulating interlayer, a method of using SOG (Spin On Glass) is known. In this method, a solution obtained by mixing a component (e.g., a silanol compound) as a material for an insulating film and a solvent (e.g., ethyl alcohol) is coated on a wafer W having a wiring pattern formed thereon, and the solvent and the like are evaporated by a heat treatment to accelerate a polymerization reaction, thereby forming an insulating film.

In this method, if an underlayer, e.g., an $SiO_2$ film is exposed to the atmosphere (while the wafer W is transferred to a coating process) before an SOG solution is coated, organic substances adheres to the surface of the $SiO_2$ film. As a result, the affinity between the SOG solution and the $SiO_2$ film deteriorates owing to the influence of the organic substances. For this reason, the SOG solution is coated unevenly, or cracks tend to be produced by a heat treatment after the coating process, resulting in a deterioration in the insulation and adhesion characteristics of the insulating interlayer.

According to this embodiment, there is provided a method and apparatus which can form a multilayered coating film having a good adhesion characteristic by removing organic substances adhering to an object to be processed. More specifically, after a film is formed on an object to be processed, the object is placed in an ozone atmosphere to decompose/remove organic substances adhering to the film, and a coating solution is coated on this film. In this method, organic substances may be decomposed/removed by radiating ultraviolet rays on the substances instead of decomposing/removing the substances in an ozone atmosphere. In this case, it is preferable that ultraviolet rays be radiated on the object while the object is heated. This organic substance decomposing/removing process is preferably performed before the next process when the object is exposed to the atmosphere in the process of loading the object. It is further preferable that the organic substance decomposing/removing process be performed before each coating process when a laminated film is to be formed.

This embodiment is characterized by comprising a surface cleaning means for decomposing/removing organic substances adhering to the surface of an object to be processed, and a coating means for coating a coating solution on the object surface after a surface cleaning process. In the apparatus of the embodiment, the surface cleaning means preferably includes a means for heating an object to be processed in a surface cleaning process.

According to this embodiment, when ultraviolet rays are radiated on a film formed on an object to be processed, ozone ($O_3$) is formed from oxygen ($O_2$) in the atmosphere, and oxygen radicals ($O^*$) are also produced. These ozone and oxygen radicals decompose/remove organic substances adhering to the film surface. Since a coating solution is coated on the film from which the organic substances are removed in this manner, the affinity between the coating solution and the film improves to prevent uneven coating of the coating solution and cracks by a heat treatment after the coating process. Therefore, a multilayered coating film having an excellent adhesion characteristic can be formed. In this case, by heating the object in the decomposing/removing process, the organic substances can be decomposed/removed further effectively.

Figure 9:
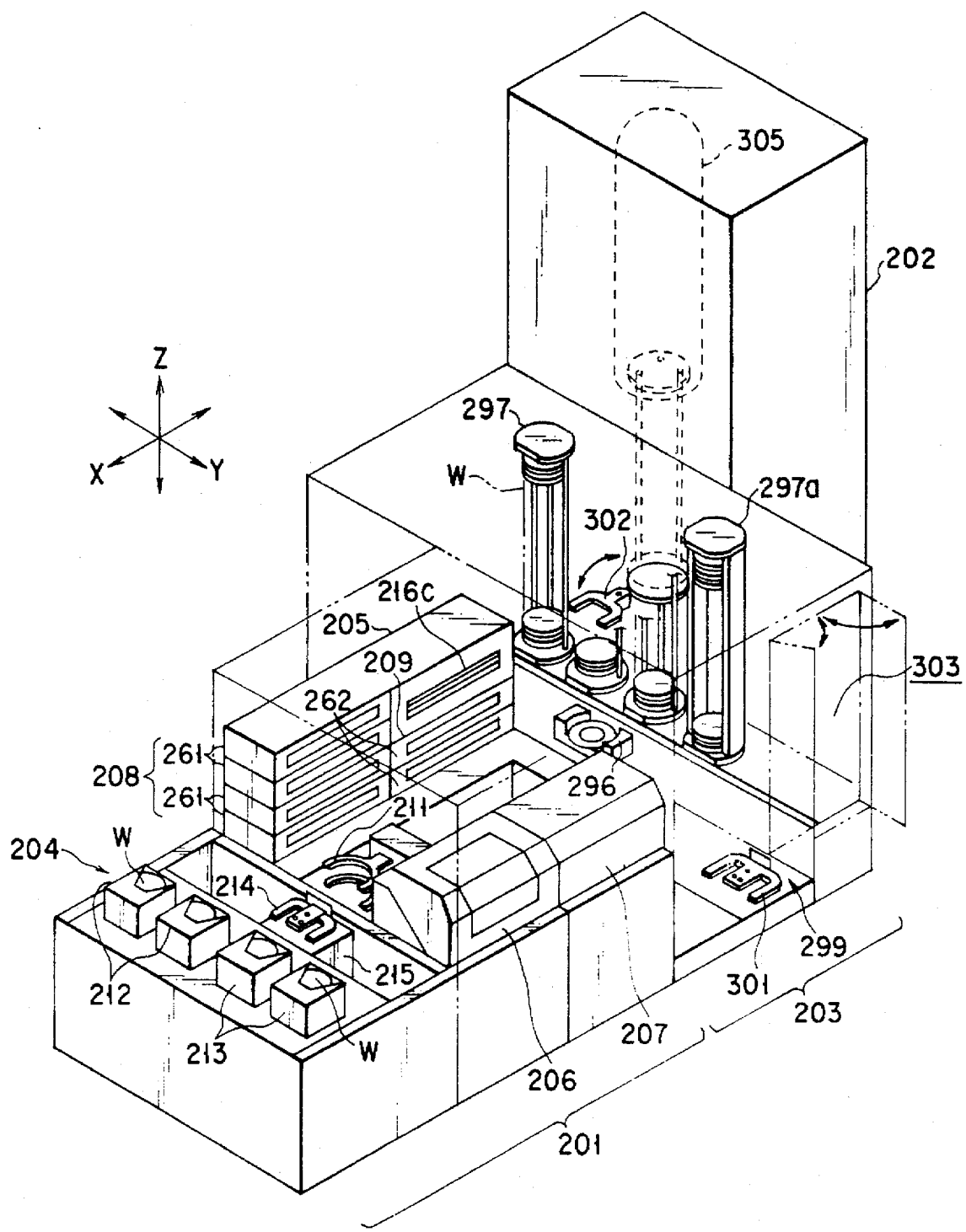
FIGS. 9 and 10 are schematic views for explaining a substrate process apparatus according to Example 2.
Figure 10:
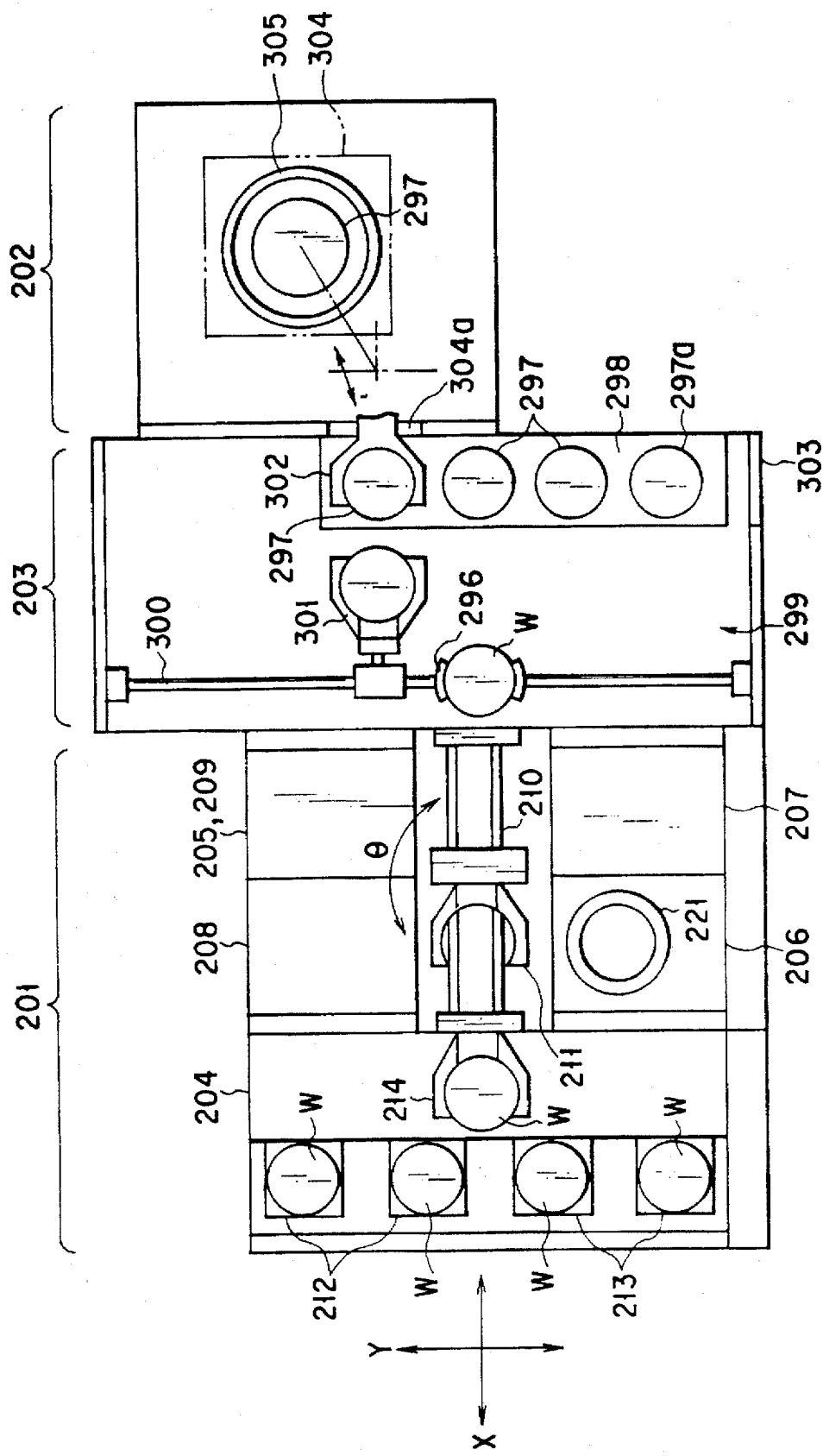

FIGS. 9 and 10 are schematic views for explaining an apparatus according to Example 2. An SOG coating/heating apparatus will be described as an example. This SOG coating/heating apparatus is mainly constituted by a coating process section 201 for forming an SOG film (coating film) on an object to be processed, e.g., a wafer W, by coating a coating solution on the wafer W and drying it, a heat-treatment section 202 for performing heat treatment of the wafer W and calcining the SOG film, and an interface section 203 for exchanging the wafer W between the coating process section 201 and the heat-treatment section 202.

The coating process section 201 is constituted by a load/unload section 204, a surface cleaning process section 205, an SOG coating section 206, a chemical reservoir section 207, a pre-baking process section 208, a cooling process section 209, and the like. The load/unload section 204 serves to load/unload the wafer W. The surface cleaning process section 205 radiates ultraviolet rays on the surface of the wafer W to decompose/remove organic substances adhering to the surface. The SOG coating section 206 coats an SOG solution on the surface of the wafer W by, e.g., spin coating. The chemical reservoir section 207 is used to store an SOG solution or the like used by the SOG coating section 206. The pre-baking process section 208 heats the wafer W at a predetermined temperature after an SOG solution is coated on the wafer W, thereby drying the SOG solution. The cooling process section 209 cools the wafer W to a predetermined temperature. Since a method of removing organic substances by using ozone generated by radiating ultraviolet rays is disclosed in Jpn. Pat. Appln. KOKAI Publication No. 61-290724, a detailed description thereof will be omitted. A main convey path 210 is arranged in the central portion of the coating process section 201. A main convey handler 211 is arranged in the main convey path 210 to be movable in the horizontal direction (indicated by arrows X and Y in FIG. 9), the vertical direction (indicated by an arrow Z), and the rotational direction (indicated by an arrow θ). The respective process sections 205 to 209 are arranged on both sides f the main convey path 210.

The load/unload section 204 includes carrier cassettes 212 and 213 arranged in a line in the Y direction, and a wafer holding arm 214. The carrier cassettes 212 are used to store unprocessed wafers W (an $SiO_2$ film as an underlayer is formed on the wiring pattern formation surface of each wafer by a plasma CVD method) on which no SOG films are formed. The carrier cassettes 213 are used to store processed wafers W. The wafer holding arm 214 is designed to be movable in the arranging direction (the Y direction in FIG. 9) of the carrier cassettes 212 and 213, the horizontal direction (the X direction), and the vertical direction (the Z direction). This arm 214 serves to load/unload the wafers W into/from the carrier cassettes 212 and 213. A transfer base 215 for transferring the wafer W between the wafer holding arm 214 and the main convey handler 211 is arranged near one end portion of the main convey path 210 of the load/unload section 204.

Figure 11:
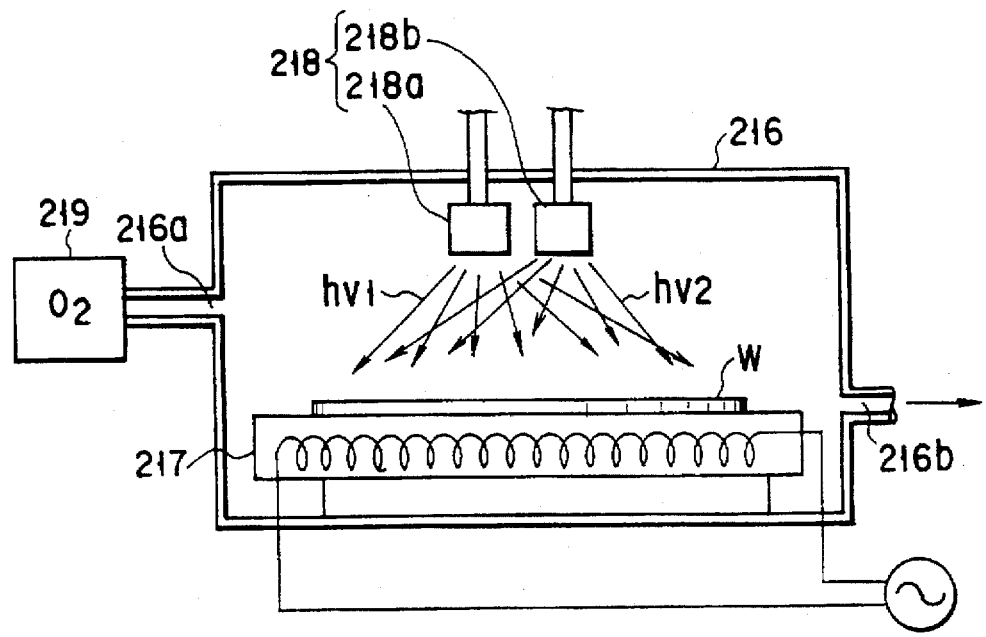
FIG. 11 is a view showing a surface cleaning process section in the apparatus shown in FIG. 9.
Figure 12:
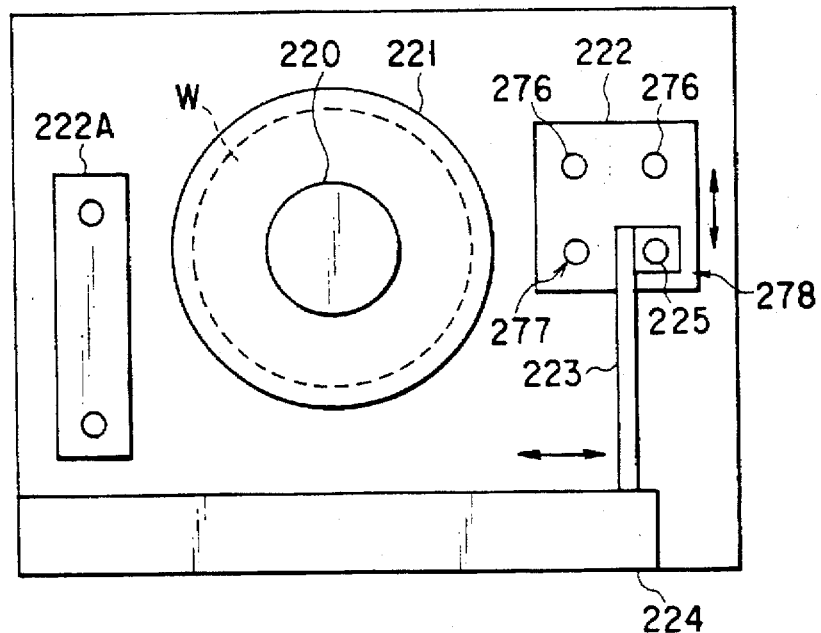
FIGS. 12 and 16 are views for explaining an SOG coating process section in the apparatus shown in FIG. 9.

As shown in FIG. 11, the surface cleaning process section 205 is substantially constituted by an electric heating type hot plate 217, which uses a nichrome wire heater, and an ultraviolet lamp 218. The hot plate 217 is arranged near the bottom portion of a process chamber 216. The ultraviolet lamp 218 is arranged near the ceiling portion of the process chamber 216. In this case, the ultraviolet lamp 218 is constituted by two ultraviolet lamp bodies 218a (emission wavelength: 184 nm and 218b (emission wavelength: 254 nm) for emitting ultraviolet rays having different emission wavelengths. An $O_2$ supply port 216a connected to an oxygen ($O_2$) source 219 is formed in one side wall of the process chamber 216. An outlet 216b is formed in the side wall opposing the $O_2$ supply port 216a. A wafer entrance 216c (see FIG. 9) of the process chamber 216 is hermetically sealed by an automatic opening/closing shutter (not shown). After the wafer W is placed on the hot plate 217 by the main convey handler 211, the wafer entrance 216c is closed by the shutter, and $O_2$ is introduced into the process chamber 216.

In the surface cleaning process section 205 having the above arrangement, while the wafer W is heated to a predetermined temperature by the hot plate 217, ultraviolet rays can be radiated from the ultraviolet lamp 218 (specifically the ultraviolet lamp bodies 218a and 218b) onto the surface of the wafer W. In this case, the wafer W is heated to, e.g., 100° C. by the hot plate 217, and $O_2$ supplied into the process chamber 216 is converted into ozone ($O_3$) by ultraviolet rays having a wavelength of 184 nm, which is emitted from the ultraviolet lamp body 218a. This ozone is then excited and activated by ultraviolet rays having a wavelength of 254 nm, which is emitted from the ultraviolet lamp body 218b, to produce oxygen radicals (O*), thereby removing organic substances by using this oxygen radicals. This process can be performed for several tens seconds.

As shown in FIGS. 12 and 13A to 13C, the main portion of the SOG coating section 206 is constituted by a spin chuck 220 for holding the wafer W by vacuum suction and rotating it horizontally, a process cap 221 having a cylindrical shape with a bottom and enclosing the spin chuck 220, a nozzle convey arm 223 for selectively moving a supply nozzle 225 for, e.g., an SOG solution to a position above the spin chuck 220 or a nozzle wait section 222, and an arm moving mechanism 224 for moving the nozzle convey arm 223.

The lower end portion of the spin chuck 220 is fixed to a rotating shaft 227 of a motor 226 for rotating the spin chuck 220 and the wafer W at a predetermined rotational speed. The process cap 221 is constituted by an inner cap 228 concentrically arranged to surround a wafer holding section 220a of the spin chuck 220, and an outer cap 229 for housing the spin chuck 220 and the inner cap 228 and forming an internal process space. An exhaust port 230 and a liquid discharge port 231 are formed in the bottom portion of the outer cap 229. An exhaust unit (not shown) is connected to the exhaust port 230 via a pipe 232 so that a scattered SOG solution and particles in coating the SOG solution on the wafer W can be discharged through the exhaust port 230 together with the atmosphere in the SOG coating section 206. A discharged liquid tank (not shown) is connected to the liquid discharge port 231 via a pipe 233 so that an SOG solution and the like which flow downward along the inner surface of the outer cap 229 and the inner cap 228 and are stored in the bottom portion of the outer cap 229 can be discharged and recovered through the liquid discharge port 231.

Figure 14:
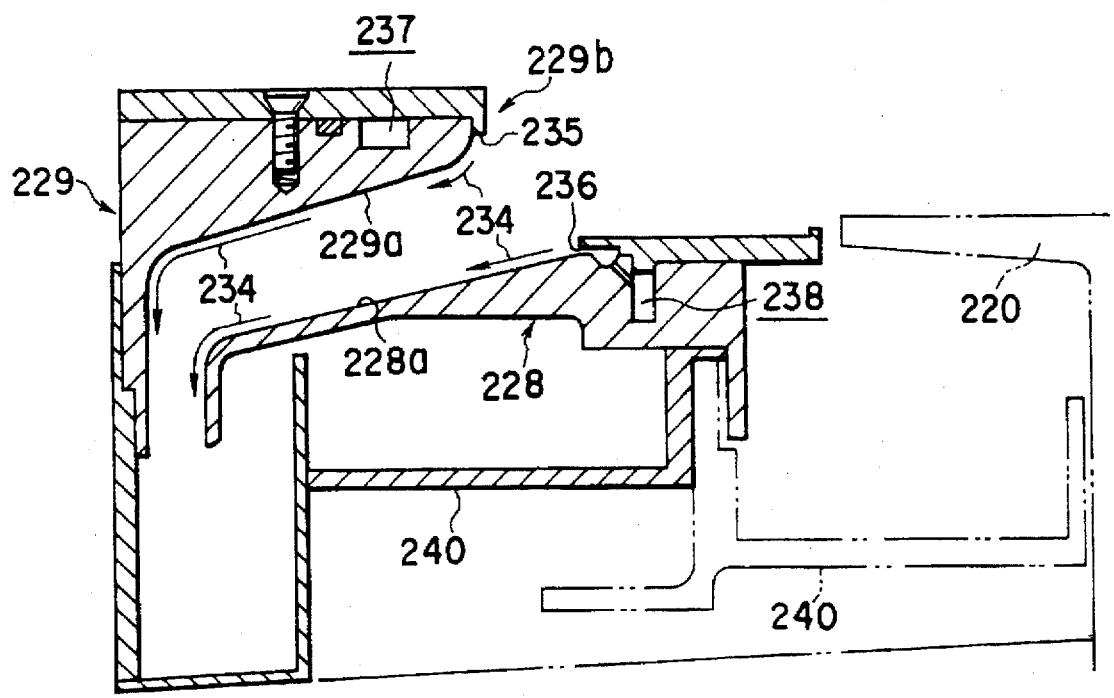

An SOG solution which is thrown and scattered upon rotation of the wafer W adheres to the inner surface of the process cap 221. If this state is left as it is, the SOG solution is crystallized and solidifies to produce particles or disturb the flow of air in the process cap 221, resulting in a deterioration in coating uniformity. For this reason, the scattered SOG solution must be properly cleaned and removed. For this purpose, as shown in FIG. 14, slit-like cleaning solution outlets 235 for allowing a cleaning solution 234 such as isopropyl alcohol (IPA) to flow downward to an inner surface 220a of the outer cup are formed in an upper opening edge portion 229b of the outer cap 229, throughout the entire circumference, at proper angular intervals. In addition, slit-like cleaning solution outlets 236 for allowing the cleaning solution 234 to flow downward to an outward inclined surface 228a of the inner cap 228 are formed in the upper end portion of the inner cap 228, throughout the entire circumference, at proper angular intervals. These cleaning solution outlets 235 and 236 respectively communicate with annular solution reservoir portions 237 and 238 formed in the outer and inner caps 229 and 228. By supplying the cleaning solution 234 from a cleaning solution source (not shown) to the solution reservoir portions 237 and 238 via a temperature adjusting means and a flow rate adjusting means, the cleaning solution 234 can be sprayed from the cleaning solution outlets 235 and 236 at a proper flow rate and a proper temperature. A cleaning process for the process cap 221, which is performed by causing the cleaning solution 234 to flow downward, is performed every time, for example, coating of an SOG solution on one wafer W is completed. Note that members such as a base member 240 in the inner cap 228, which are easily corroded by an organic solvent such as cyclohexanone used for cap cleaning, side rinsing, back rinsing, and the like and hence are difficult to clean are preferably subjected to a Tuframe process to improve in chemical resistance. As a component, e.g., an air pipe such as an air cylinder, arranged near the process cap 221, to which an SOG solution may adhere, for example, a fluoroplastic tube which is resistant to cyclohexanone is preferably used.

Figure 15:
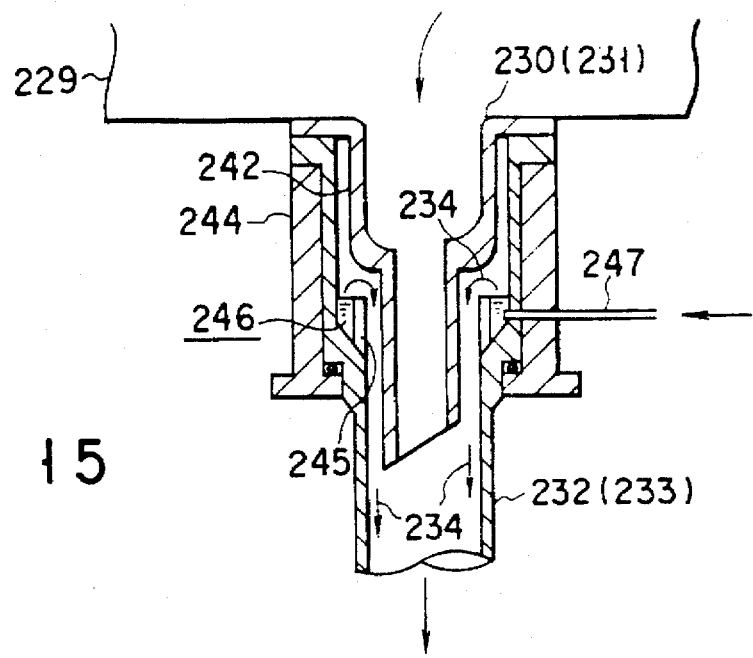

As shown in FIG. 15, the connecting portion between the exhaust port 230 (liquid discharge port 231) of the process cap 221 and the pipe 232 (233) is designed such that a jacket member 244 mounted on the distal end of the pipe 232 (233) is fitted and fixed on a nozzle 242 mounted on the exhaust port 230 (liquid discharge port 231). A dam 245 having the same inner diameter as that of the pipe 232 (233) is arranged in the jacket member 244 so that a liquid reservoir groove 246 is formed along the inner surface of the jacket member 244. In addition, a cleaning solution supply pipe 247 for supplying the cleaning solution 234 to the liquid reservoir groove 246 extends through a wall portion of the jacket member 244. The cleaning solution 234 is supplied from a cleaning solution source (not shown) to the liquid reservoir groove 246 via the cleaning solution supply pipe 247, and the cleaning solution gradually overflows the dam 245. With this operation, the cleaning solution 234 is caused to flow downward to the entire inner surface of the pipe 232 (233) to constantly perform a cleaning operation.

As shown in FIG. 13A, the SOG solution supply nozzle 225 is connected to an SOG solution tank 251 via an SOG supply pipe 250. A pressure gas supply controller 252 is connected to the SOG solution tank 251. The pressure gas supply controller 252 pressurizes and supplies an SOG solution into the SOG solution tank 251 while controlling the flow rate of helium (He) as a pressure gas. When the pressure gas supply controller 252 is operated, and an opening/closing valve 253 arranged midway along the SOG supply pipe 250 is opened, an SOG solution 254 in the SOG solution tank 251 is supplied to the supply nozzle 225 via the SOG supply pipe 250 and supplied (e.g., dropped) onto the wafer W held by the spin chuck 220. As a pressure gas supply pipe 257 for the SOG supply pipe 250 and the pressure gas supply controller 252, a synthetic resin tube, e.g., a fluoroplastic tube, is used in consideration of chemical resistance to cyclohexanone. The SOG solution tank 251 and the pressure gas supply controller 252 are arranged in the chemical reservoir section 207 adjacent to the SOG coating section 206. The temperature of the SOG solution 254 in the SOG solution tank 251 is kept at about 10° C. by a temperature adjusting means (not shown) in the chemical reservoir section 207. A heat exchanger 255 as a temperature adjusting means for adjusting the temperature of the SOG solution 254, which is supplied for a coating process, to, e.g., about 23° C. is arranged midway along the SOG supply pipe 250 near the supply nozzle 225. The heat exchanger 255 circulates temperature-adjusted water 256 in a heat exchanger body 255a accommodating part of the SOG supply pipe 250, thereby performing heat exchange between the temperature-adjusted water 256 an the SOG solution 254 via the tube wall of the SOG supply pipe 250. Note that a temperature adjusting means similar to the above means is preferably arranged for the supply nozzle 225. In addition, for example, a conductive tape 258 is wound around another portion of the SOG supply pipe 250. This conductive tape 258 is grounded to a body frame 260 or the like of an insulating interlayer forming unit via a conductive line 259. With this arrangement, charging of the SOG solution 254 supplied to the SOG supply pipe 250 and the wafer W can be prevented to prevent adhesion/mixture of particles by static electricity. In addition, an antistatic film may be coated/formed on the surface of the SOG supply pipe 250.

Figure 16:
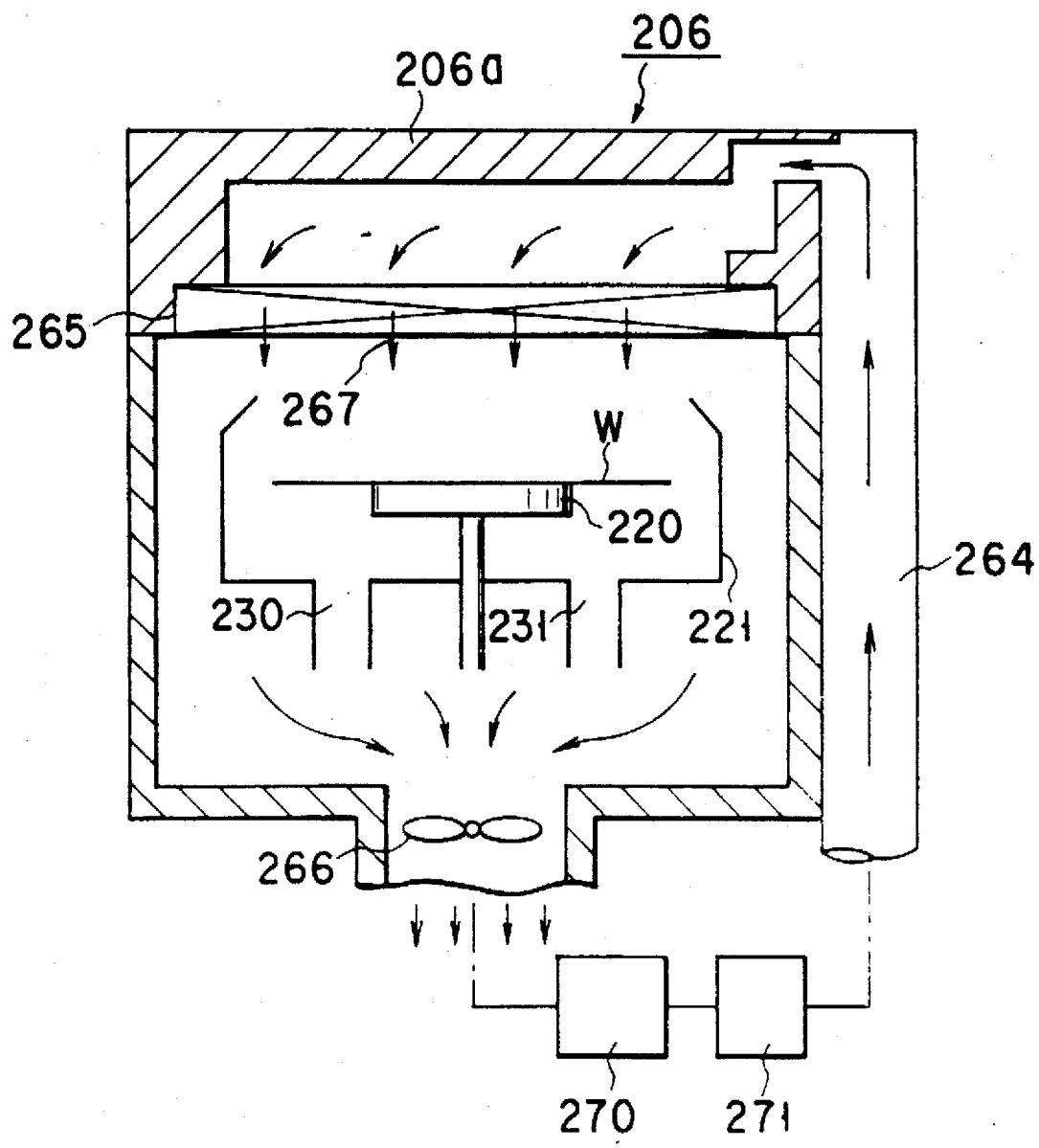

As shown in FIG. 16, in this SOG coating section 206, clean air 267 which is introduced into a process section body 206a via a ventilation pipe 264 can be caused to flow downward via a filter 265 arranged on the ceiling portion and can be forcibly exhausted through the bottom portion by a fan 266. With this arrangement, the SOG coating section 206 can always perform a process in a clean atmosphere. In this case, as indicated by the chain line in FIG. 16, the bottom portion of the process section body 206a may be connected to the ventilation pipe 264 to form a circulation path, and a temperature adjusting unit 270 and a moisture preventing unit 271 may be arranged in this circulation path, thereby circulating/supplying the clean air 267 whose temperature and moisture are adjusted to constant values. In addition, an air flow detector (not shown) is preferably arranged near the lower surface of the filter 265 so that the outlet amount of the clean air 267 can be automatically adjusted.

The nozzle wait section 222 of the SOG coating section 206 includes a nozzle holding section 276, a dummy dispensing section 277, and a wait section 278. The nozzle holding section 276 serves to hold the nozzle which is not used. The dummy dispensing section 277 causes the supply nozzle 225 in use, which is held by the nozzle convey arm 223, to discharge the SOG solution 254, in a predetermined amount, other than a solution actually used for a coating process, and discards the SOG solution which has changed in quality. The dummy dispensing section 277 also serves to prevent clogging of the supply nozzle 225. The wait section 278 allows the supply nozzle 225 in use to temporarily wait. Note that a side rinsing nozzle wait section 222A for dissolving/removing an SOG solution coated on the peripheral portion of the wafer W is arranged on the opposite side of the spin chuck 220 to the nozzle wait section 222.

As shown in FIG. 17A, the dummy dispensing section 277 is constituted by an annular block 279 having a double structure constituted by inner and outer members. A through hole 280 is vertically formed in the annular block 279. The supply nozzle 225 is inserted into the through hole 280 and caused to spray the SOG solution 254, and the SOG solution 254 is discharged via a liquid discharge pipe 284 connected to the lower end portion of the through hole 280. A chemical-resistant material such as a fluoroplastic material is used for an inner member 281 of the annular block 279 and the inner member 281. An annular liquid reservoir groove 282 is formed in the inner member 281 with its inner wall portion being left as a dam 283. A cleaning solution supply path 285 for supplying the cleaning solution 234, e.g., IPA, to the liquid reservoir groove 282 extends through the wall portion of the annular block 279. The cleaning solution 234 is supplied from a cleaning solution source (not shown) to the liquid reservoir groove 282 via the cleaning solution supply path 285, and the cleaning solution gradually overflows the dam 283, thereby causing the cleaning solution 234 to uniformly flow downward to the entire inner surface of the liquid discharge pipe 284. With this operation, a cleaning process can be performed. A purge gas introducing flow path 286 and a discharge flow path 287 are symmetrically formed at the nozzle insertion position of the annular block 279 to extend through the wall portion of the annular block 279. By supplying a clean purge gas such as a nitrogen ($N_2$) gas around the supply nozzle 225, a dummy dispensing process can be performed in a clean atmosphere.

Figure 18:
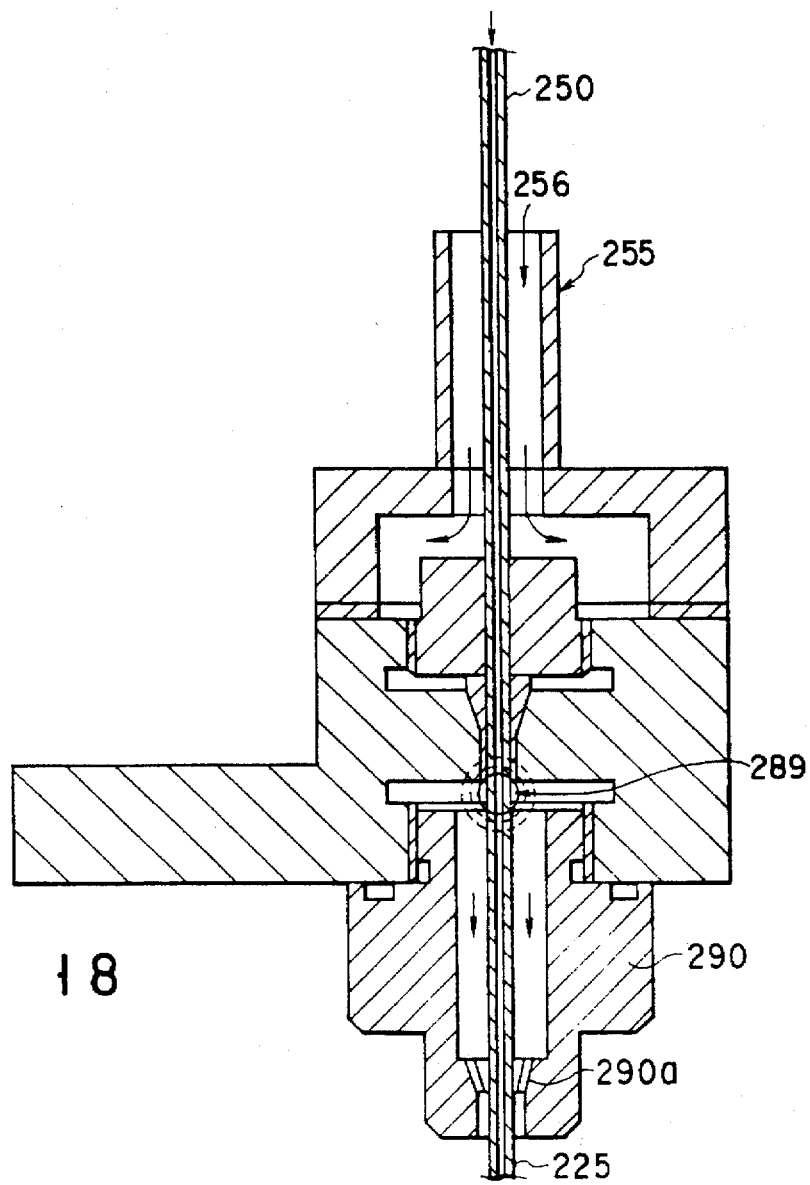

This dummy dispensing section 277 is also used to clean a portion around the supply nozzle 225. In this case, for example, as shown in FIG. 17A, a cleaning solution supply pipe 288 is connected to a side portion of a nozzle body 225a, and a cleaning solution from the cleaning solution supply pipe 288 is supplied and caused to flow downward to the proximal end portion of the supply nozzle 225 via a flow path 289 in the nozzle body 225a, thereby cleaning a portion around the supply nozzle 225. In addition, as shown in FIG. 18, a jacket 290 made of a tubular member is coaxially arranged around the supply nozzle 225, and the distal end of the supply nozzle 225 is caused to communicate with the jacket 290 via a communication path 290a. In this arrangement, by supplying a cleaning solution to the distal end portion of the supply nozzle 225, a portion around the supply nozzle 225 can be effectively cleaned.

As shown in FIG. 17B, a wait section 278 is constituted by a tank block 291 having a double structure constituted by inner and outer members. A solvent supply flow path 293 for supplying an organic solvent, e.g., ethyl alcohol as a solvent for SOG, into a tank 292 extends through a wall portion near a bottom portion 291a of the tank block 291. In addition, a solvent discharge flow path 294 extends through a wall portion, of the tank block 291, located near the insertion position of the supply nozzle 225. A solvent 295 is supplied from a cleaning solution source (not shown) into the tank 292 via the solvent supply flow path 293 and caused to flow out from the solvent discharge flow path 294. With this operation, the amount of the solvent 295 stored in the tank 292 can always be kept constant. Therefore, when the supply nozzle 225 is inserted into the tank 292, and an upper opening portion 292a is sealed by the nozzle body, a space above a solvent liquid level 295a in the tank 292 is filled with a saturation atmosphere of the solvent 295, thereby preventing an SOG solution at a nozzle distal end portion 225b from solidifying during a wait period.

The pre-baking process section 208 is constituted by a plurality (four in this case) of heat-treatment units 261 stacked on each other. Each heat-treatment unit 261 has an electric heating type hot plate for heating the wafer W while it is placed thereon. One wafer W is loaded into each heat-treatment unit 261 to heat the wafer W, thereby drying an SOG solution coated on the wafer surface. In this case, the process temperature is set to be 100° to 140° C.; and the process time, about 1 to 5 min.

The cooling process section 209 is constituted by a plurality (two in this case) of cooling process units 262 stacked on each other. Each cooling process unit 262 has a water-cooling type cool plate (not shown) for cooling the wafer W while it is placed thereon. The wafers W heated by the surface cleaning process section 205 and the pre-baking process section 208 are loaded, one by one, into the cooling process units 262. Each cooling process unit 262 can cool the wafer W to room temperature, e.g., about 22° C.

Figure 19:
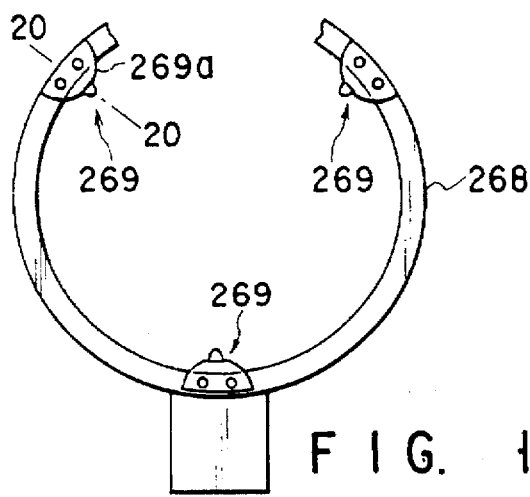
FIG. 19 is a plan view showing a main convey arm in the apparatus shown in FIG. 9.
Figure 20:
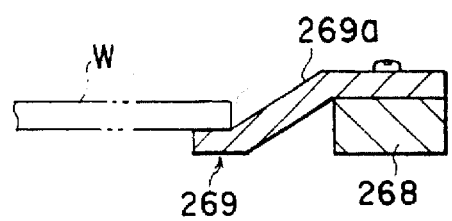
FIG. 20 is a sectional view taken along a line 20—20 in FIG. 19.

For example, two main convey handlers 211 are respectively arranged at upper and lower positions. The two main convey handlers 211 can be driven independently. As shown in FIGS. 19 and 20, each main convey handler 211 has a wafer support frame 268 having a partially notched annular shape. Pawls 269 are formed at three portions of the wafer support frame 268, i.e., the two end portions and proximal end portion of the wafer support frame 268. The pawls 269 are engaged with the edge portion of the wafer W to support the wafer. These pawls 269 position the wafer W by causing the wafer W to drop on inclined surfaces 269a formed on the inside portions of the pawls 269, thereby preventing the wafer W from shifting while it is conveyed. By using these two handlers, two wafers W can be concurrently loaded/unloaded into/from the respective process sections 205 to 209. Consequently, the process efficiency can be improved. In addition, as a material for the pawls 269 of the main convey handlers 211, a polyimide resin having a high strength and a high heat resistance is preferably used.

The interface section 203, which is adjacent to the coating process section 201 and serves to load/unload the wafer W into/from the heat-treatment section 202, includes an intermediate transfer base 296 located near an end portion of the main convey path 210 and having a positioning function. In the interface section 203, a plurality (three in FIGS. 9 and 10) of quartz wafer boats 297 are detachably mounted, together with a dummy wafer boat 297a, on a movable base 298 which is movable in the Y direction with respect to the surface of the heat-treatment section 202. In each wafer boat, wafers W are respectively arranged/held in multiple stages in the vertical direction. The dummy wafer boat 297a serves to replenish each wafer boat 297 with dummy wafers. In addition, a transfer/convey mechanism 299 is arranged between the intermediate transfer base 296 and the movable base 298. The transfer/convey mechanism 299 is constituted by a convey path 300 extending in the arranging direction of the wafer boats 297, and a convey arm 301, arranged in the convey path 300 to be movable in the X, Y, Z, and θ directions, for conveying the wafer W which has undergone a coating process and is placed on the intermediate transfer base 296 into the wafer boat 297. Note that an entrance 303 is formed in a side portion of the interface section 203. An operator can go into and get out of the interface section 203 through the entrance 303.

The heat-treatment section 202 includes a boat elevator (not shown), a heat-treatment furnace 304, and a boat convey arm 302. The wafer boat 297 is placed on the boat elevator to be movable in the vertical direction. The heat-treatment furnace 304 is arranged above the boat elevator. The heat-treatment furnace 304 includes a quartz process tube 305, having an elongated cap-like shape, for storing the wafer boat 297 on the boat elevator, and a heater (not shown) outside the quartz process tube 305. The boat convey arm 302 serves to exchange the wafer boat 297 between the movable base 298 in the interface section 203 and the boat elevator via an opening window 304a. In the heat-treatment section 202, the heating temperature is set to be about 400° C.; and the process time, about 30 to 90 min.

A process of forming an insulating interlayer (SOG film) by using the apparatus of this embodiment having the above arrangement will be described next with reference to FIGS. 21A to 21E.

The load/unload section 204 of the coating process section 201 receives the carrier cassettes 212, each storing a predetermined number of wafers W. A wiring pattern 310 and an $SiO_2$ film 311 (underlayer) are formed on the surface of each wafer W by a plasma CVD apparatus and a wiring pattern forming apparatus (none are shown) installed at positions different from that of the coating process section 201. The wafer holding arm 214 of the load/unload section 204 takes out these wafers W from the carrier cassette 212 one by one, and passes them to the main convey handler 211 via the transfer base 215.

Each wafer W is conveyed first to the surface cleaning process section 205 by the main convey handler 211. In this section, the wafer W is heated to almost 100° C. on the hot plate 217 and irradiated with ultraviolet rays emitted from the ultraviolet lamp 218. With this operation, the bonds of carbons (C) in the $SiO_2$ film are decomposed. At the same time, $O_2$ is converted into ozone by ultraviolet rays emitted from, e.g., the ultraviolet lamp body 218a (emission wavelength: 184 nm), and oxygen radicals (O*) are produced by ultraviolet rays emitted from the ultraviolet lamp body 218b (emission wavelength: 254 nm). An organic substance 312 adhering to the surface of the $SiO_2$ film 311 is subjected to ashing and decomposed/removed by these oxygen radicals upon a chemical reaction (FIG. 21A). This surface cleaning process is performed very efficiently owing to the synergistic effect of radiation of ultraviolet rays and heating. Thereafter, the wafer W is conveyed to the cooling process section 209 to cool the wafer W to room temperature (FIG. 21B). The wafer W is transferred to the spin chuck 220 of the SOG coating section 206. While the wafer W is rotated at a predetermined rotational speed, the SOG solution 254 is dropped from the supply nozzle 225 onto the surface of the $SiO_2$ film 311, thereby coating the SOG solution 254 on the surface (FIG. 21C). At this time, the SOG solution 254 is dropped while the supply nozzle 225 is scanned in the radial direction of the wafer W. After this operation, the wafer W is conveyed to the pre-baking process section 208, in which the wafer W is heated to, e.g., 120° C. to evaporate and dry the solvent of the SOG solution 254, thereby forming an SOG film 313 (FIG. 21D).

After the process performed by the coating process section 201, the wafers W are transferred from the main convey handler 211 to the convey arm 301 of the interface section 203 via the intermediate transfer base 296, and are sequentially stored in the wafer boat 297. After a predetermined number (e.g., 50) of wafers W are set in the wafer boat 297, together with a total of 10 dummy wafer, i.e., five dummy wafers set above or below the wafers W, the wafer boat 297 is placed on the boat elevator by the boat convey arm 302. The boat elevator is raised to place the wafer boat 297 in the quartz process tube 305. In the heat-treatment furnace 304, the wafer boat 297 is externally heated while a purge gas is introduced into the quartz process tube 305, thereby performing a heat treatment, e.g., curing, with respect to the SOG films 313 on the wafers W held by the wafer boat 297 altogether (FIG. 21E).

After this heat treatment, the wafer boat 297 is taken out from the heat-treatment section 202 by the boat convey arm 302 and returned to the movable base 298 of the interface section 203. With a reverse operation to the above operation, the wafer W is transferred to the main convey handler 211 of the coating process section 201. The wafer W is then transferred to the wafer holding arm 214 on the transfer base 215 of the load/unload section 204 to be stored in the carrier cassette 213.

After the organic substance 312 on the surface of the $SiO_2$ film 311 is decomposed/removed by radiating ultraviolet rays on the wafer W, the SOG solution 254 is coated on the SiO$_2$ film 311. With this operation, the affinity between the SOG solution 254 and the SiO$_2$ film 311 is improved to prevent uneven coating of the SOG solution 254 and cracks caused by a drying and curing processes after the coating process. Therefore, an insulating interlayer (SiO$_2$ film) 313 having good insulation and adhesion characteristics can be formed.

Figure 22A:
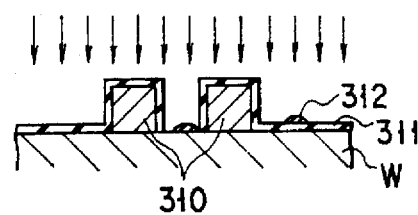
Figure 22B:
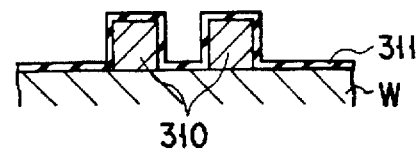
Figure 22C:
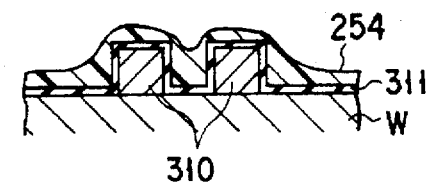
Figure 22D:
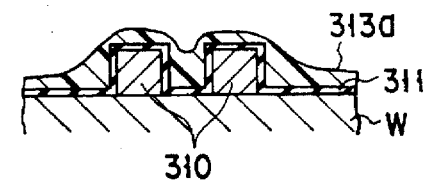
Figure 22E:
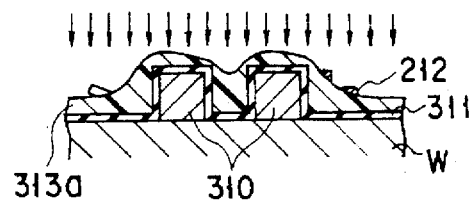
Figure 22F:
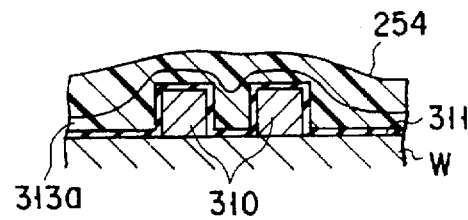
Figure 22G:
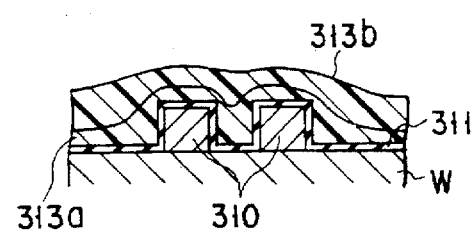
Figure 22H:
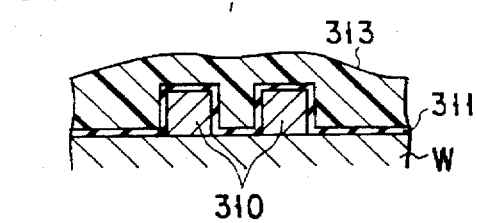

Assume that the SOG solution 254 cannot be coated thick on the surface of the SiO$_2$ film 311 at once. In this case, first of all, a surface cleaning process and a cooling process (FIGS. 22A and 22B) are performed. An SOG solution coating process and a drying process are then performed to form a first SOG film 313a (FIGS. 22C and 22D). Thereafter, ultraviolet rays are radiated on the wafer W to decompose/remove the organic substance 312 (the residual organic substance of the SOG film 313a in this case) on the surface of the first SOG film 313a (FIG. 22E). An SOG solution coating process and a drying process are performed again to form a second SOG film 313b (FIGS. 22F and 22G), and a curing process is performed (FIG. 22H), thereby obtaining an insulating interlayer (SiO$_2$ film) 313 having a good adhesion characteristic and a predetermined thickness.

Figure 23A:
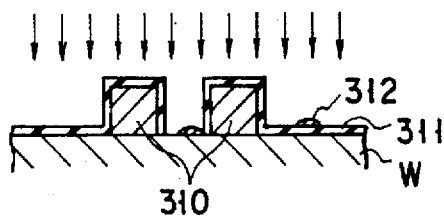
Figure 23B:
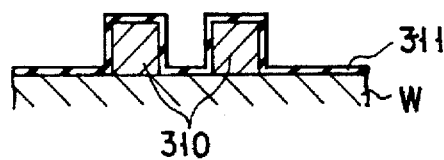
Figure 23C:
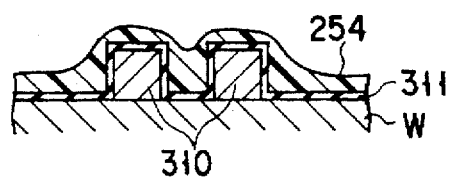
Figure 23D:
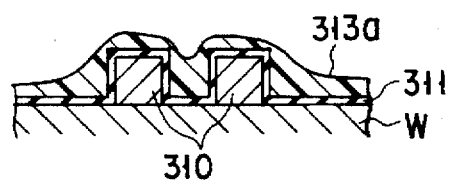
Figure 23E:
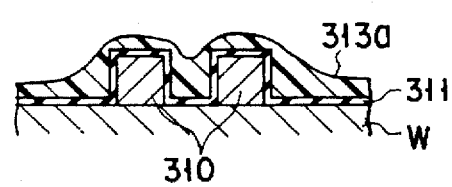
Figure 23F:
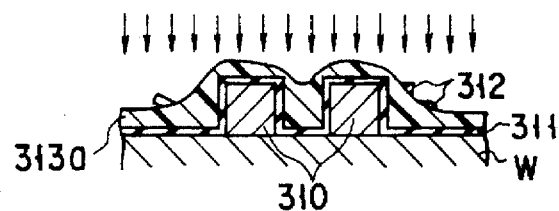
Figure 23G:
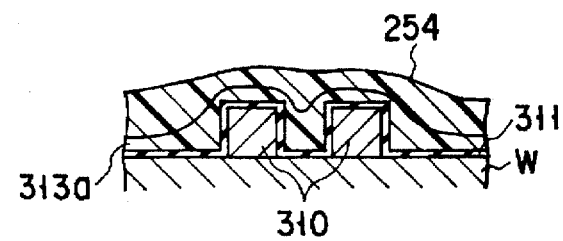
Figure 23H:
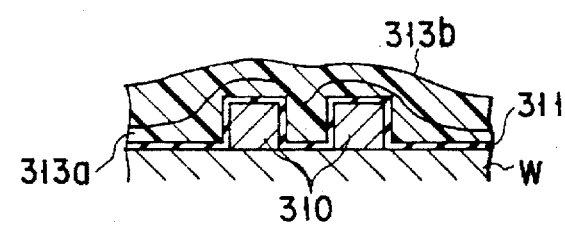
Figure 23I:
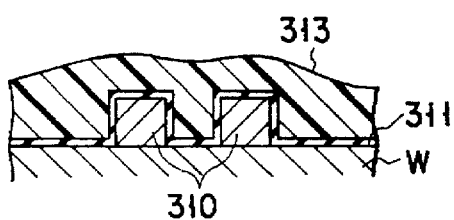

An insulating interlayer (SiO$_2$ film) 313 having a good adhesion characteristic and a predetermined thickness can also be obtained in the following manner, as shown in FIGS. 23A to 23I. After a drying process is performed with respect to the first SOG film 313a (FIG. 23D), a curing process is performed (FIG. 23E). Ultraviolet rays are radiated on the wafer W to decompose/remove the organic substance 312 on the surface of the first SOG film 313a (FIG. 23F). An SOG solution coating process and a drying process are performed again to form the second SOG film 313b (FIGS. 23G and 23H). Thereafter, a curing process is performed again (FIG. 23I). Note that the steps in FIGS. 23A to 23C are the same as those in FIGS. 22A to 22C.

This embodiment is most suitable for the formation of an inorganic SOG film. In the embodiment, ultraviolet rays are radiated on an underlayer, i.e., an SiO$_2$ film or an SOG film as an undercoating, formed on the wafer W surface to produce ozone and oxygen radicals so as to decompose/remove organic substances on the underlayer or the SOG film as the undercoating. Especially when an organic SOG film is to be formed, ozone may be directly supplied to the wafer W surface, without using an ultraviolet lamp, to decompose/remove organic substances. More specifically, as shown in FIGS. 24 and 25, for example, an ozone generating unit 321 using corona discharge is connected to the process chamber 216 of the surface cleaning process section 205 via an ozone supply pipe 320. Ozone generated by the ozone generating unit 321 is supplied into the process chamber 216 to decompose/remove organic substances in an underlayer (SiO$_2$ film) or an SOG film (especially an organic SOG film) on the wafer W surface. In addition, since ozone (O$_3$) and oxygen radicals (O*) give no ion impact to a film upon reactions with organic substances, the organic substances can be removed without adversely affecting the film quality, unlike in ion etching. In addition, ozone (O$_3$) and oxygen radicals not only remove the residual organic substance in the SOG film but also increase the number of bonds of Si and O, and hence give no adverse effect on the SOG film. Note that the portions in FIGS. 24 and 25 other than that described above are the same as those in FIGS. 9 and 10. Therefore, the same reference numerals in FIGS. 24 and 25 denote the same parts as in FIGS. 9 and 10, and a description thereof will be omitted.

In the case wherein an object to be processed is loaded into a heat-treatment furnace, installed at a different position, after a coating process, if a long period of time elapses before the object is loaded into the heat-treatment furnace, since the SOG is hygroscopic and organic substances are dissociated in the SOG film, the hygroscopicity of the object further increases. In order to prevent such a phenomenon, for example, the SOG film is preferably made to have a hydrophobic nature by adhering hexamethyldisilane to the SOG film as the object after a coating process.

In this example, an insulating interlayer is formed on the wafer W by continuously performing a coating step and a heat-treatment step. The process method and apparatus of this example can also be applied to a case wherein a similar insulating interlayer is formed on an LCD substrate or the like. In addition, this example can be applied to only a coating step. Furthermore, in processing an object to be processed, which has been exposed to the atmosphere, by loading it into a process section, this example can be applied to a case wherein the object surface is set in an ozone atmosphere or in a surface cleaning process section using ultraviolet radiation before the above process is executed.

EXAMPLE 3

As described above, SOG includes organic SOG basically containing an organic component, and inorganic SOG basically containing no organic component. Although an inorganic SOG film has a dense composition consisting of only inorganic substances and hence is low in hygroscopicity, it tends to shrink owing to a stress generated upon a curing process. For this reason, it is difficult to form a thick film by one coating step, and coating must be performed twice to form a thick film. In contrast to this, since an organic SOG film is not easily caused to shrink by a stress generated by a curing process, a thick film can be obtained by one 10 coating step. However, the organic SOG film tends to deteriorate in film quality because it contains organic substances. In addition, organic substances are deposited on the surface of the SOG film owing to an etching back effect. More specifically, in etching back of an SOG film, although a reaction product produced by an etching gas, e.g., a CF$_4$ gas, and inorganic SiO in the SOG film is gasified, the etching gas and organic substances do not basically cause any reaction. Even if a reaction is caused, the reaction product (organic compound) is not gasified but remains as it is. Therefore, organic substances are inevitably deposited on the surface of the SOG film, even though the thickness of the deposition film is on the micron order. If a plasma CVD film is formed on such an organic deposition film in the next step, the adhesion of each film deteriorates. Consequently, the films can be easily separated from each other.

In order to remove organic substances deposited on the surface of the SOG film after etching back, a general ashing method using an oxygen plasma may be used. In this ashing method, however, since organic substances are removed by a physical force, i.e., by radiating a plasma or ions on an SOG film, damage such as a crystal defect may be caused to the SOG film. In addition, even if organic substances are simply removed from the surface of the SOG film by an ashing process, organic substances still remain in the film. Therefore, the film quality itself cannot be improved.

This example has been made in consideration of the above problem, and has as its object to improve the film quality of an SOG film by effectively removing organic substances not only from the film surface but also from the inside of the film without damaging the SOG film. More specifically, this example is characterized by comprising the first step of coating an SOG film on a predetermined underlying film, the second step of curing the SOG film by annealing after the first step, the third step of flattening the surface of the SOG film by etching back the SOG film after the second step, and the fourth step of removing organic substances from the SOG film by exposing the SOG film to an ozone atmosphere while heating it to a predetermined temperature after the third step. In the addition, this example is characterized by comprising the first step of coating an SOG film on a predetermined underlying film, the second step of removing organic substances from the SOG film by exposing the SOG to an ozone atmosphere while heating it to a predetermined temperature after the first step, and the third step of curing the SOG film by annealing after the second step.

The present inventors have found the following important fact. When an SOG film was exposed to an ozone atmosphere while it was heated to a predetermined temperature, oxygen radicals produced by thermal decomposition of ozone chemically reacted with organic substances in the SOG film as well as organic substances on the surface of the SOG film. Owing to the reaction in the film, inorganic substances recombined with each other at portions from which organic substances are removed. As a result, the chains of the bonds of inorganic substances were elongated to improve the quality of the SOG film. Therefore, according to the first aspect of this example, in the fourth step, organic substances deposited on the surface of the SOG film in the third step (etching back step) are removed by a chemical reaction between the oxygen radicals and the organic substances. In addition, according to the second aspect of this example, in the second step, organic substances as stains adhering to the surface of the SOG film are removed by a chemical reaction between the oxygen radicals and the organic substances, and at the same time, organic substances in the film are removed. Therefore, the SOG film is cured in the third step (annealing step) while it contains no or little organic substances. In this example, since organic substances are removed from an SOG film by a chemical reaction of an oxygen radical without giving no physical impact to the film, there is no possibility of damage to the SOG film.

FIG. 26 schematically shows the arrangement of an apparatus for performing an ozone process to remove organic substances from an SOG film by using the above method of this example. This apparatus includes a process chamber or vessel 410 which can be sealed. A disk-like heat plate 412 as a mount base is arranged in the center of the process chamber 410. The heat plate 412 is made of a metal having a high thermal conductivity, e.g., aluminum. The wafer W having an SOG film is placed, as an object to be processed, on the upper surface of the heat plate 412. In the process chamber 410, the heat plate 412 incorporates a heater, e.g., a heating resistive element 414, for heating the wafer, and a gas introduction chamber 416 for supplying ozone as a process gas or an atmospheric gas to the wafer W is arranged outside the heat plate 412 in the circumferential direction.

An oxygen source 418, an ozone generator 420, and a gas flow rate controlling unit 422 are arranged outside the process chamber 410 to be connected in series with the gas introduction chamber 416 of the process chamber 410 via a pipe 424. The oxygen source 418 serves to supply oxygen as a material for ozone. The ozone generator 420 generates ozone by using oxygen supplied from the oxygen source 418. The gas flow rate controlling unit 422 controls the flow rate of ozone supplied to the process chamber 410. An opening/closing valve 426 is arranged midway along the pipe 424. An exhaust port 410a is formed in the central portion of the ceiling of the process chamber 410. An exhaust unit 430 constituted by a vacuum pump is connected to the exhaust port 410a via a pipe 428.

Ozone supplied from the ozone generator 420 into the gas introduction chamber 416 in the process chamber 410 via the pipe 424 is uniformly sprayed from many gas spray ports 416a, formed in the upper surface of the gas introduction chamber 416 at a predetermined pitch, at a predetermined flow rate in the circumferential direction. The ozone then flows near the surface of an object to be processed (wafer W) and is exhausted from the exhaust port 410a in the ceiling. The heater (heating resistive element 414) incorporated in the heat plate 412 in the process chamber 410 is electrically connected to a temperature controller 432 arranged outside the chamber so that the surface of the wafer W can be heated to a desired temperature under the control of the temperature controller 432.

In the process chamber 410, when the wafer W is exposed to ozone having a predetermined concentration under a predetermined pressure (reduced pressure) for a predetermined period of time while the wafer W is heated to a predetermined temperature, oxygen radicals O* produced by thermal decomposition of ozone properly cause oxidation with an organic substance $C_LH_MO_N$ adhering to or contained in the SOG film on the wafer surface (reaction products $CO_2$ and $H_2O$ are exhausted through the exhaust port 410a), thereby effectively removing the organic substance from the entire surface of the SOG film.

According to the first aspect of this example, an organic SOG film is coated on a predetermined underlying film, e.g., an $SiO_2$ film, to a predetermined thickness by a coating step using a general method, e.g., the spin coating method. The SOG film is then cured in an annealing step using a general method, e.g., a heat treatment using a vertical heat-treatment furnace. The surface of the SOG film is flattened by an etching back step using a general method, e.g., a dry etching method of a cold wall scheme using a $CF_4$ gas as an etching gas. The resultant wafer W is subjected to an ozone process in the process apparatus of this example.

In this case, even after an etching back step, organic substances are deposited on the surface of the SOG film, and a considerable amount of organic substance is also left in the SOG film. In this example, a deposition film of organic substances can be properly removed from the surface of the SOG film of the wafer W, and at the same time, organic substances in the SOG film can be effectively removed, thereby improving the quality of the SOG, by properly setting process conditions, e.g., the process surface temperature: 150° to 1,400° C.; the flow rate of ozone: 15 to 30 l/min; the ozone concentration: 5 to 20 wt %; the pressure near the process surface: 200 to 700 Torr; and the process time: 10 to 180 sec.

As described above, an ozone process in this embodiment allows effective removal of organic substances from the entire SOG film, and hence can be performed before an etching back step, e.g., after a coating step. In this case, in an SOG solution coating step, a drying step of evaporating a solvent in the SOG solution by heating the SOG solution to about 100° to 150° C. (i.e., a pre-baking step) is generally performed, as needed, immediately after the SOG solution is coated. For this reason, it is preferable that the wafer W be loaded into the process chamber 410 after such a drying step, and an ozone process be performed under the above process conditions. With this process, the SOG film is cured by an annealing step after organic substances are removed by this ozone process. As a result, inorganic substance Si—O bonds recombine with each other with longer chains in the SOG film, and good film quality can be obtained. Furthermore, since no or little organic substance is left in the cured SOG film, no organic substance is deposited on the surface of the SOG film in the next etching back step. Note that an organic substance removing step of this example may be performed prior to an etching back step after an annealing step. Moreover, a coating step, an organic substance removing step, an annealing step, and an organic substance removing step may be performed in the order named.

Figure 27:
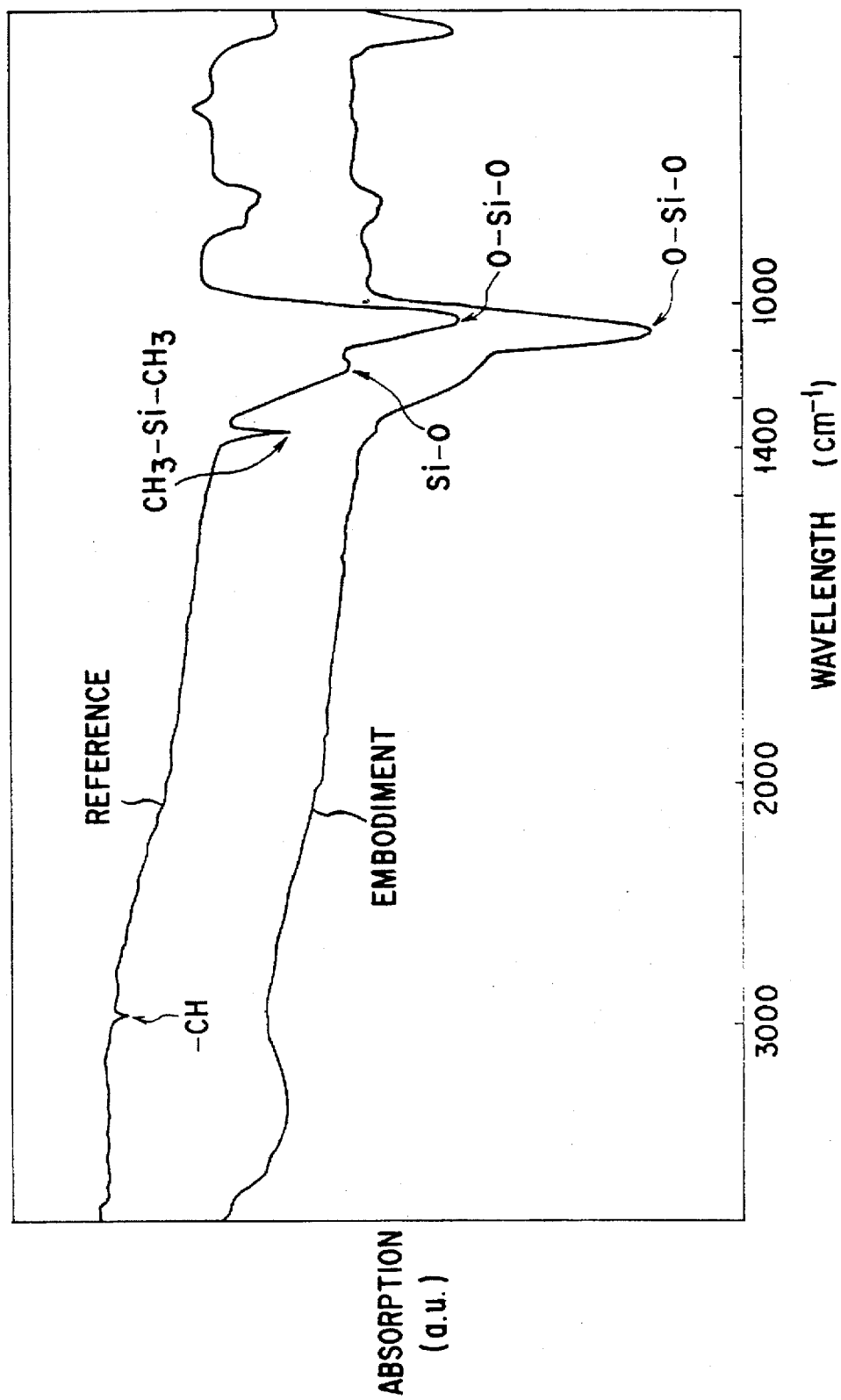
FIG. 27 is a graph showing infrared absorption spectra showing the effect of Example 3.

FIG. 27 shows infrared absorption spectra obtained from an SOG film which has undergone an ozone process, and an SOG film which has not undergone an ozone process. In the SOG film (reference) formed without undergoing an ozone process, in addition to absorption peaks at —$CH_3$ and $CH_3$—Si—$CH_3$ bonds as organic substances, there are two peaks at inorganic substance bonds, i.e., an O—Si—O bond having a long chain and an Si—O bond having a short chain. In contrast to this, in the SOG film formed upon an ozone process according to the example, there are no absorption peaks corresponding to —$CH_3$ and $CH_3$—Si—$CH_3$ bonds as organic substances. In addition, there is no absorption peaks corresponding to an Si—O bond having a short chain as an inorganic substance. The absorption peak corresponding to an O—Si—O bond increases accordingly. That is, according to an ozone process of the example, when oxygen radicals O* produced by thermal decomposition of ozone react with an organic substance $C_L H_M O_N$ in an SOG film, an organic group (—$CH_3$) is removed or dissociated, and Si and O recombine with each other in a portion from which the organic group is removed. As a result, the chain of the Si—O bond is elongated. In addition, in the example, since an organic substance removing process is performed by a method of removing an organic by means of a chemical reaction caused by oxygen radicals, an SOG film is free from physical damage.

As described above, by performing an ozone process of this embodiment with respect to an SOG film before or after an annealing step, organic substances can be effectively removed from the entire SOG film, i.e., not only from the film surface but also from the inside of the film, without damaging the SOG film. Even if, therefore, a plasma CVD film is formed on the SOG film in the nest step, the two films exhibit excellent adhesion characteristics, and peeling of the films and the like do not occur. A stable multilayered wiring structure can be obtained. Note that the above description is associated with an organic SOG film. However, the example can also be applied to an inorganic SOG film.

As described above, according to the method of this example, organic substances can be effectively removed not only from the surface of an SOG but also from the inside of the film without damaging the SOG film, thereby improving the film quality.

According to the present invention, the above examples can be applied in combination with each other, as needed, in accordance with process steps.

As has been described above, according to the present invention, the double-sided substrate cleaning apparatus comprises a carrier station for loading/unloading a carrier in which objects to be processed are stored, a convey mechanism for conveying an object taken out from the carrier station, at least one cleaning mechanism, arranged along a convey path on which the convey mechanism conveys the object, for cleaning the object, and an object reversing mechanism, arranged along the convey path, for reversing the object. With this arrangement, the apparatus can improve the throughput of various processes.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A resist treating method comprising the steps of:

unloading an object to be processed from a carrier in which the object having two major surfaces is stored, conveying the object to a resist coating mechanism, and applying a resist coating treatment to one major surface of the object within said resist coating mechanism;

reversing the object after the resist coating treatment outside said resist coating mechanism;

conveying the reversed object to a cleaning mechanism, and applying a cleaning treatment to the other major surface of the object within said cleaning mechanism;

reversing the object after said cleaning treatment outside said cleaning mechanism;

conveying the reversed object to an exposure apparatus, and applying an exposure treatment to the coating film within said exposure apparatus; and conveying the object after the exposure treatment to a developing apparatus for applying a developing treatment to the coating film.

2. A method according to claim 1, further comprising the step of applying a cleaning treatment to one major surface of said object before applying said resist coating treatment to said one major surface.

3. A method according to claim 1, wherein fluid is supplied to a clearance between a surface opposite to the cleaning surface of said object and an object-supporting table to generate a negative pressure in said clearance, thereby sucking said object to said object-supporting table.

4. A method according to claim 1, wherein said object is positioned with respect to said cleaning mechanism before the object is reversed.

5. A method according to claim 1, wherein said cleaning treatment is applied with a brush pressed against the cleaning surface of the object.

6. A method according to claim 1, wherein a pure water having the temperature controlled is used in said cleaning treatment.

* * * * *